United States Patent
Fukutani et al.

(10) Patent No.: US 8,547,697 B2
(45) Date of Patent: Oct. 1, 2013

(54) FIXING STRUCTURE AND FIXING METHOD OF CIRCUIT BOARD WITH EMBEDDED ELECTRONIC PARTS TO COOLER

(75) Inventors: Keita Fukutani, Anjo (JP); Kuniaki Mamitsu, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 208 days.

(21) Appl. No.: 13/170,554

(22) Filed: Jun. 28, 2011

(65) Prior Publication Data
US 2011/0317366 A1    Dec. 29, 2011

(30) Foreign Application Priority Data
Jun. 29, 2010   (JP) .................. 2010-147870

(51) Int. Cl.
*H05K 7/20* (2006.01)
(52) U.S. Cl.
USPC ........... 361/699; 361/689; 361/698; 361/707; 165/80.4
(58) Field of Classification Search
None
See application file for complete search history.

(56) References Cited

U.S. PATENT DOCUMENTS

| | | | | |
|---|---|---|---|---|
| 6,137,691 A | * | 10/2000 | Jang | 361/784 |
| 6,501,653 B1 | * | 12/2002 | Landsgestell et al. | 361/699 |
| 6,788,537 B2 | * | 9/2004 | Saita et al. | 361/700 |
| 7,289,327 B2 | * | 10/2007 | Goodwin et al. | 361/701 |
| 7,525,498 B2 | * | 4/2009 | Quan et al. | 343/770 |
| 7,571,759 B2 | | 8/2009 | Inagaki et al. | |
| 7,787,254 B2 | * | 8/2010 | Clayton et al. | 361/749 |
| 2002/0192442 A1 | | 12/2002 | Kondo et al. | |
| 2006/0119512 A1 | | 6/2006 | Yoshimatsu et al. | |

FOREIGN PATENT DOCUMENTS

| | | |
|---|---|---|
| JP | A-4-346295 | 12/1992 |
| JP | A-2004-282804 | 10/2004 |
| JP | A-2005-237141 | 9/2005 |
| JP | A-2007-115946 | 5/2007 |
| JP | A-2009-159815 | 7/2009 |
| JP | A-2010-123760 | 6/2010 |
| JP | A-2010-228104 | 10/2010 |

* cited by examiner

*Primary Examiner* — Boris Chervinsky
(74) *Attorney, Agent, or Firm* — Posz Law Group, PLC

(57) ABSTRACT

In a fixing structure of a circuit board to a cooler, the circuit board includes a wiring part, electronic parts electrically connected to the wiring part and an insulating base material embedding the wiring part and the electronic parts therein. The insulating base material includes embedding portions in which the electronic parts are embedded and a bent portion having flexibility between the embedding portions. The cooler has fixing parts arranged in a first direction. The circuit board is fixed to the cooler while bending the bent portion. The bent portion is opposed to an end portion of one of the fixing parts, and each of the embedding portions is held between adjacent two fixing parts such that opposite surfaces of the embedding portion are closely in contact with surfaces of the adjacent two fixing parts.

18 Claims, 15 Drawing Sheets

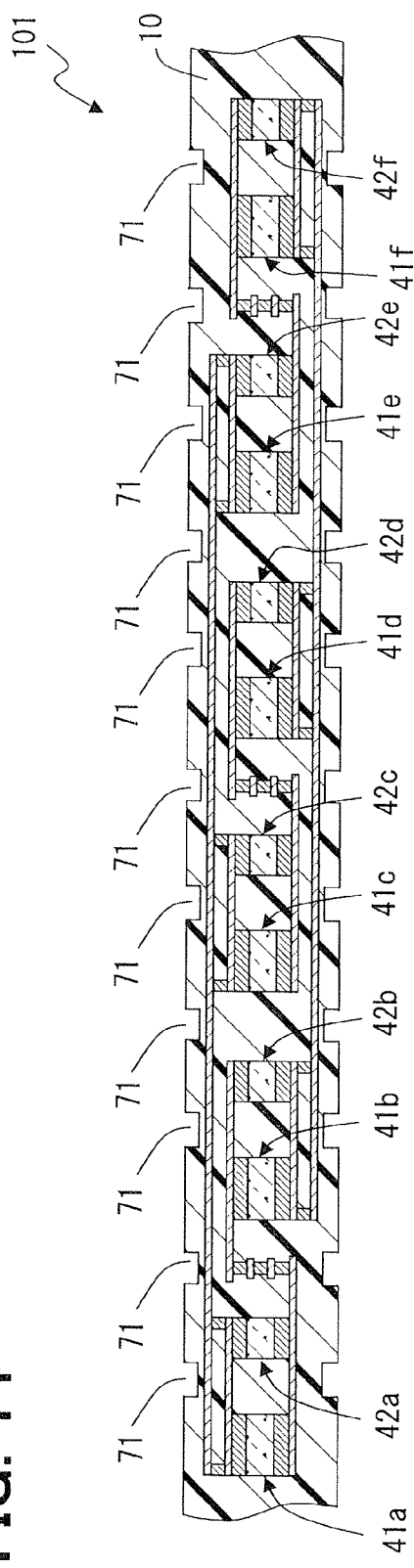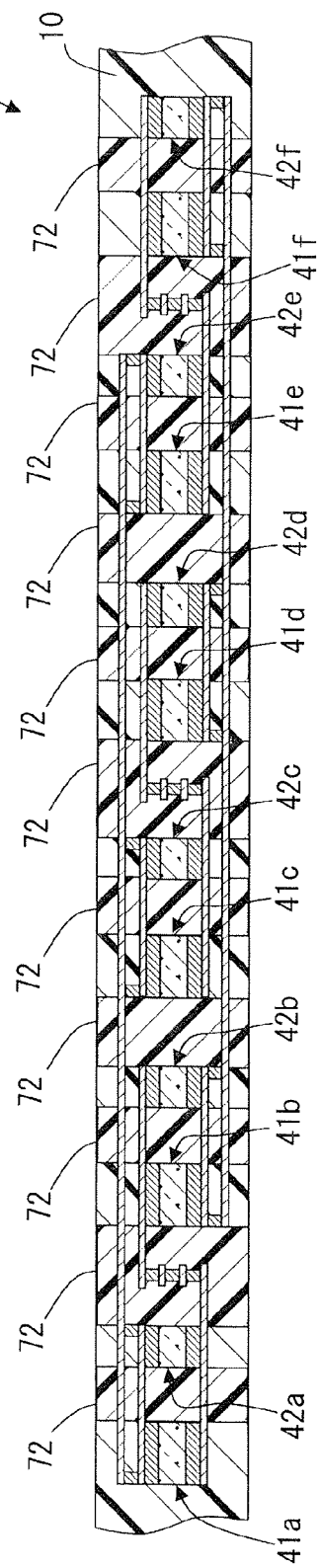

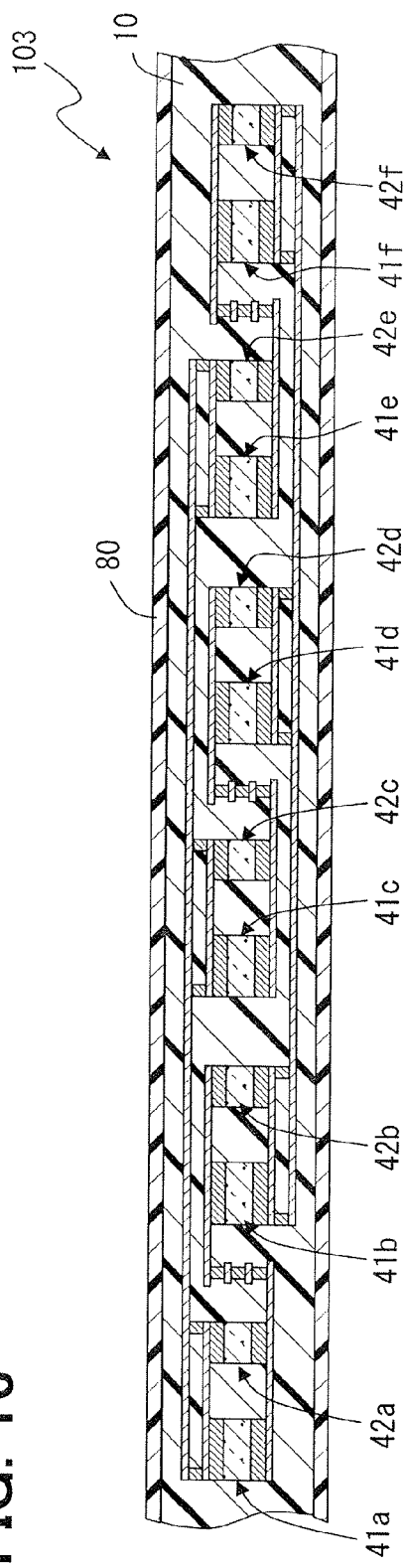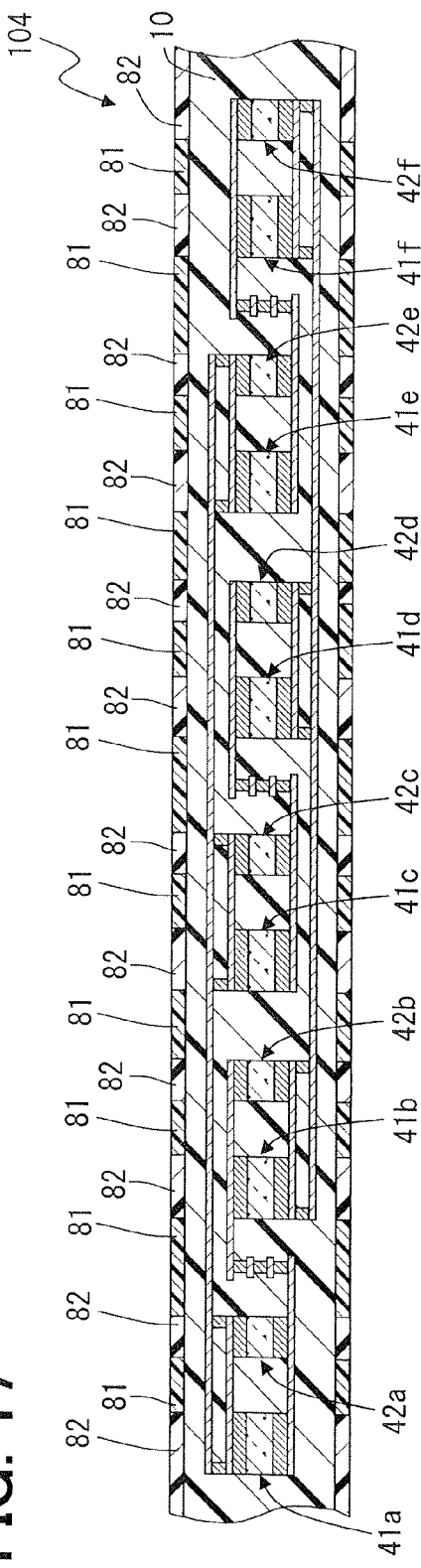

# FIXING STRUCTURE AND FIXING METHOD OF CIRCUIT BOARD WITH EMBEDDED ELECTRONIC PARTS TO COOLER

CROSS REFERENCE TO RELATED APPLICATION

This application is based on Japanese Patent Application No. 2010-147870 filed on Jun. 29, 2010, the disclosure of which is incorporated herein by reference.

FIELD OF THE INVENTION

The present invention relates to a fixing structure and a fixing method of a circuit board with embedded electronic parts to a cooler.

BACKGROUND OF THE INVENTION

For example, Japanese Patent Application Publication No. 4-346295 describes a fixing structure of a flexible circuit board to a cooler, such as a heat sink. Multiple electronic parts are fixed to the circuit board, and the circuit board is fixed to the heat sink in a winding manner.

The circuit board is made of a flexible resin film or a resin film backed with metal or the like. The circuit board has a single or multi layer structure of electrodes and wiring layers. The electronic parts are discrete parts including resistors and IC parts such as LSI chips. The electronic parts are fixed at a first surface of the circuit board to form a desired electronic circuit with the wiring layer. The circuit board to which the electronic parts are fixed is mounted to projections of the heat sink in a state where portions between the electronic parts are bent. In this case, back surfaces of the electronic parts are in pressed contact with side surfaces of the projections by a pressing force caused by bending the circuit board, thereby to improve cooling efficiency.

In such a structure, however, only the back surfaces of the electronic parts are closely in contact with the heat sink.

In order to further improve the cooling efficiency, it may be considered to make the circuit board to contact with the heat sink so that the electronic parts are cooled from both sides. In such a case, a front surface of the electronic parts may be fixed to the projection through the circuit board. In the structure of Publication No. 4-346295, however, there is a clearance, such as an air space, between the first surface of the electronic part and the circuit board. That is, because a clearance remains between the heat sink and the electronic part, it is difficult to further improve the cooling efficiency.

Further, engagement portions need to be formed on surfaces of the projections of the heat sink and the circuit board to ease positioning of the electronic parts relative to the heat sink and restrict displacement of the electronic parts after the mounting. For example, engagement projections are formed on the surfaces of the projections of the heat sink, and engagement holes are formed on the circuit board to be engaged with the engagement projections. Alternatively, a recess or a projection corresponding to the outer shape of the electronic part needs to be formed on the surface of the projection, and the electronic part is engaged with the recess or projection.

SUMMARY OF THE INVENTION

The present invention is made in view of the foregoing matter, and it is an object of the present invention to provide a fixing structure of a circuit board to a cooler, which is capable of improving cooling efficiency and restricting displacement of the circuit board relative to the cooler without requiring additional engagement portions. It is another object of the present invention to provide a fixing method for fixing a circuit board to a cooler with improved cooling efficiency, which is capable of improving positioning of the circuit board relative to the cooler and restricting displacement of the circuit board without requiring additional engagement portions.

In a fixing structure according to an aspect, a cooler includes a plurality of fixing parts arranged in a first direction, each of the fixing parts defining a refrigerant passage therein through which refrigerant flows. A circuit board includes a wiring part, a plurality of electronic parts electrically connected to the wiring part, and an insulating base material embedding the wiring part and the electronic parts therein. The insulating base material mainly contains resin. The insulating base material includes a plurality of embedding portions in which the electronic parts are embedded and a bent portion having flexibility between the embedding portions. The circuit board is fixed to the cooler. Specifically, the bent portion is opposed to an end portion of one of the fixing parts, the end portion being located at an end of the fixing part with respect to a second direction perpendicular to the first direction. Each of the embedding portions is held by adjacent two fixing parts such that opposite surfaces of the embedding portion are closely in contact with the adjacent two fixing parts.

In such a configuration, the embedding portions embedding the electronic parts therein are held between the adjacent fixing parts without interposing air spaces between the electronic parts and the fixing parts. Further, the electronic parts are cooled from both sides thereof. Therefore, the cooling efficiency improves. In addition, because the circuit board is held by the fixing parts of the cooler, additional engagement portions for fixing the circuit board to the cooler are not necessary. Further, it is less likely that the circuit board will be displaced after being fixed to the cooler.

Although the circuit board is stressed from the fixing parts due to the embedding portions being held by the adjacent fixing parts, since the electronic parts are embedded within the insulating base material, it is less likely that the stress will concentrate on the electronic parts. Further, since the electronic parts and the wiring part are integrally embedded within the insulating base material, it is not necessary to consider a creeping distance.

In a fixing method for fixing a circuit board to a cooler according to an aspect, the circuit board is first arranged on the cooler while bending a flexible portion between embedding portions embedding electronic parts therein such that the flexible portion is opposed to an end portion of a fixing part of the cooler and the embedding portions are placed between adjacent fixing parts. Then, pressure is applied to the fixing parts in a direction parallel to a first direction in which the fixing parts are arranged. Thus, opposite surfaces of the embedding portions are brought into closely contact with the adjacent fixing parts, and the embedding portions are held between the adjacent fixing parts.

According to the fixing method, the circuit board is held by the fixing parts by bringing the fixing parts into closely contact with the opposite surfaces of the embedding portions. Therefore, the circuit board is easily positioned to the cooler and displacement of the circuit board is restricted without requiring additional engagement portions.

BRIEF DESCRIPTION OF THE DRAWINGS

Other objects, features and advantages of the present invention will become more apparent from the following` detailed description made with reference to the accompanying drawings, in which like parts are designated by like reference numbers and in which:

FIG. 14 is a cross-sectional view of a circuit board with embedded electronic parts according to a second modification of the present invention;

FIG. 15 is a cross-sectional view of a circuit board with embedded electronic parts according to a third modification of the present invention;

FIG. 16 is a cross-sectional view of a circuit board with embedded electronic parts according to a fourth modification of the present invention;

FIG. 17 is a cross-sectional view of a circuit board with embedded electronic parts according to a fifth modification of the present invention;

DETAILED DESCRIPTION OF EXEMPLARY EMBODIMENT

Hereinafter, an exemplary embodiment will be described with reference to the drawings. Configuration for implementing the present invention is not limited to the following exemplary embodiment, but can be modified in various ways without departing from a technical scope of the present invention.

Figure 1:
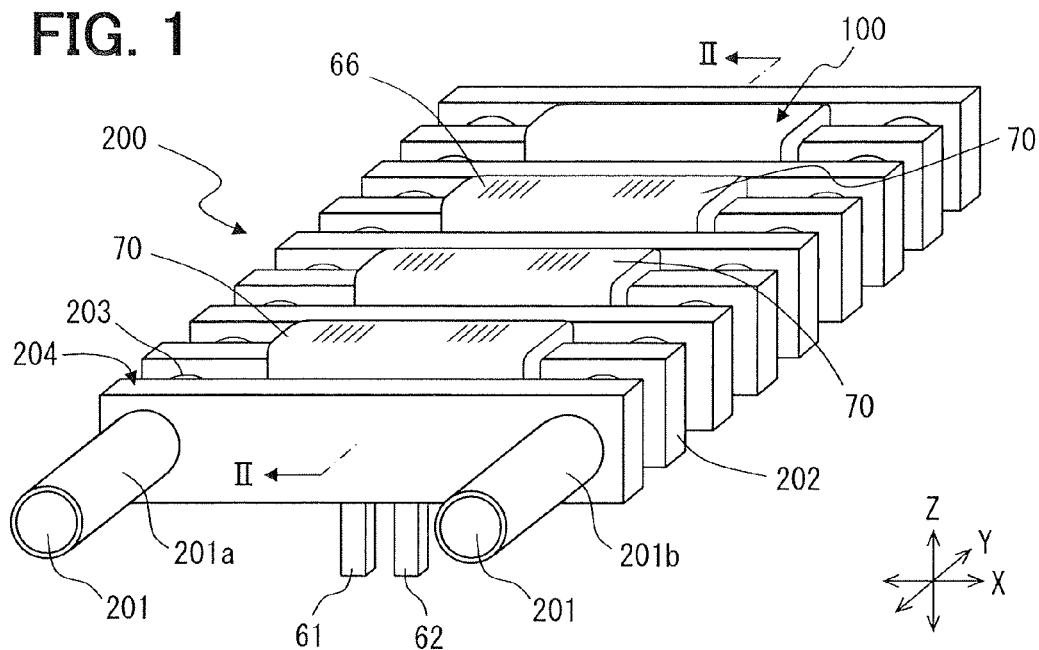
FIG. 1 is a perspective view of a fixing structure of a circuit board with embedded electronic parts to a cooler according to an embodiment of the present invention.
Figure 2:
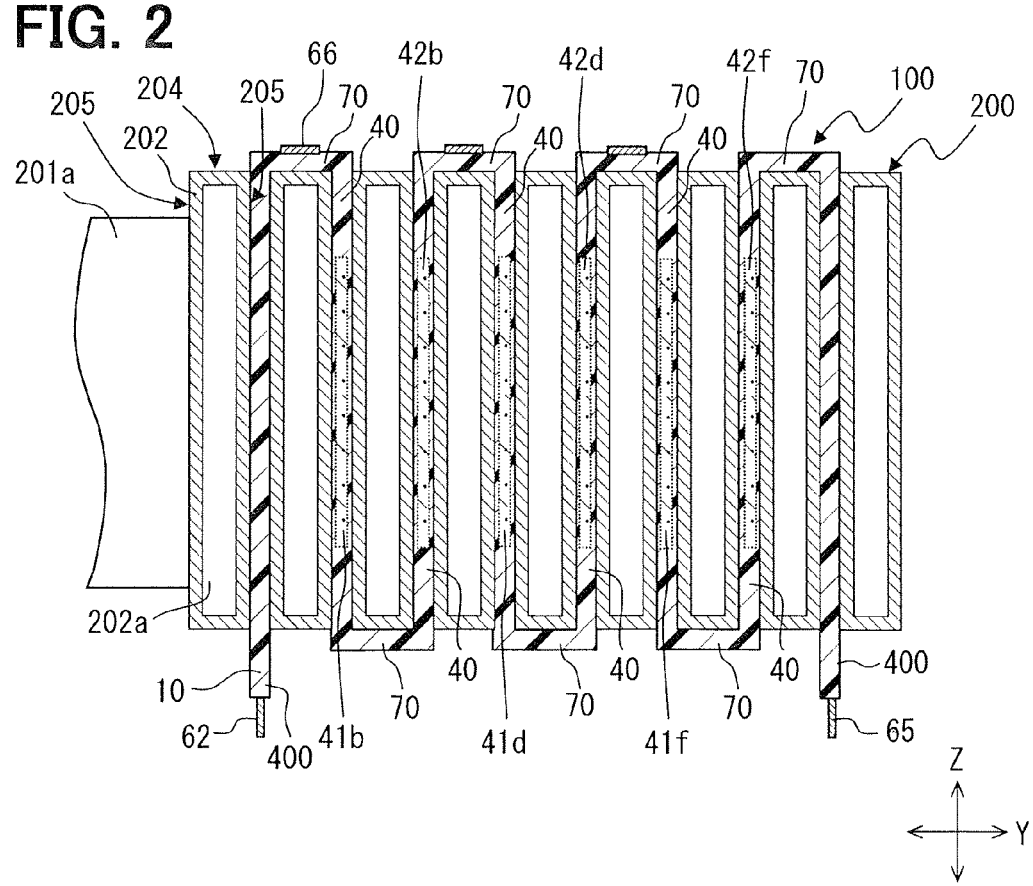
FIG. 2 is a cross-sectional view taken along a line II-II in FIG. 1.

Referring to FIGS. 1 and 2, in a fixing structure according to the embodiment, a circuit board 100 with embedded electronic parts is fixed to a cooler 200 in a winding manner.

Figure 4:
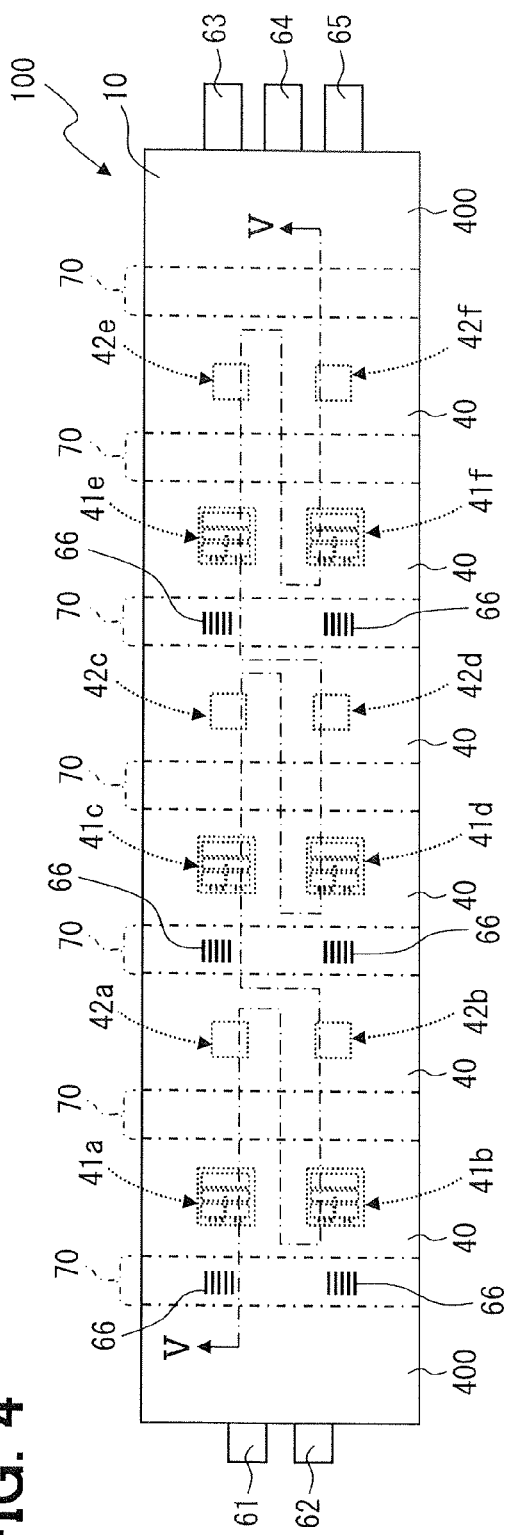
FIG. 4 is a plan view of the circuit board according to the embodiment.
Figure 5:
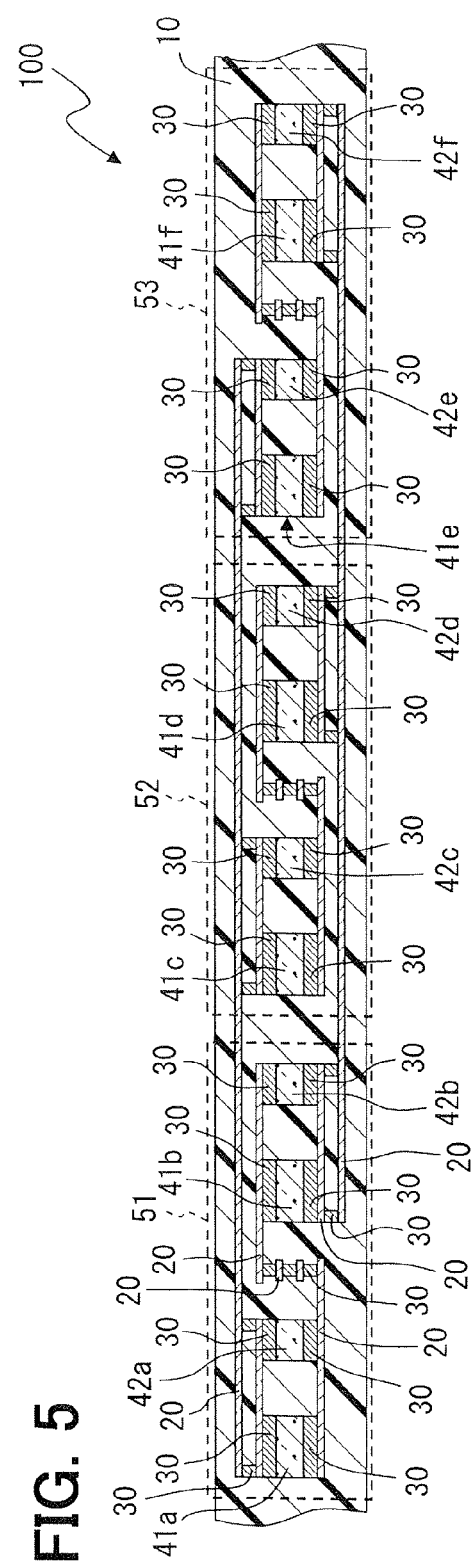
FIG. 5 is a cross-sectional view taken along a line V-V in FIG. 4.

First, a structure of the circuit board 100 will be described. Referring to FIGS. 4 and 5, the circuit board 100 includes an insulating base material 10, a wiring part embedded in the insulating base material 10, multiple electronic parts electrically connected to the wiring part, terminals 61 through 65, and pads 66, as main components.

The wiring part includes conductive patterns 20 and interlayer connecting portions 30. The electronic parts are, for example, multiple IGBTs (Insulated Gate Bipolar Transistors) 41a through 41f and diodes 42a through 42f. The IGBTs 41a through 41f and the diodes 42a through 42f are embedded in the insulating base material 10 and electrically connected to the wiring part. The terminals 61 through 65 are embedded in the insulating base material 10, but partly exposed from the insulating base material 10. The pads 66 are disposed on a surface of the insulating base material 10. Semiconductor chips, such as the IGBTs 41a through 41f and the diodes 42a through 42f, are employed as the electronic parts. However, the electronic parts are not particularly limited to the IGBTs 41a through 41f and the diodes 42a through 42f.

Figure 6:
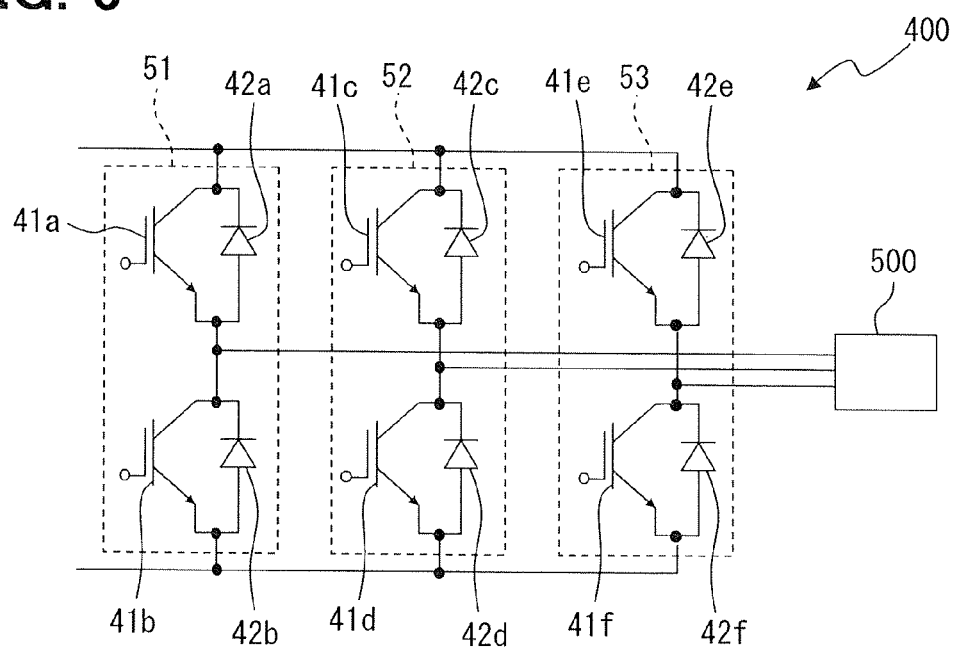
FIG. 6 is a circuit diagram showing an equivalent circuit of the circuit board according to the embodiment.

In the circuit board 100, the conductive pattern 20, the interlayer connecting portion 30, the IGBTs 41a through 41f and the diodes 42a through 42f form an inverter circuit 400 connected to a motor generator 500, as shown in an equivalent circuit of FIG. 6. As shown in FIG. 5, an U-phase arm 51 including the IBGTs 41a, 41b and the diodes 42a, 42b, a V-phase arm 52 including the IGBTs 41c, 41d and the diodes 42c, 42d, and a W-phase arm 53 including the IGBTs 41e, 41f and the diodes 42e, 42f are integrally formed in the circuit board 100 (insulating base material 10). Namely, the circuit board 100 is constructed as 6in1Package.

The insulating base material 10 has flexibility. The circuit board 100 can be referred to as a film-shape inverter (power converter) or a power module. In the present embodiment, the circuit board 100 is exemplarily constructed as the 6in1package. Alternatively, the circuit board 100 can be constructed as 3in1package, 4in1package or similar structure as long as multiple electronic parts (semiconductor chips) are embedded therein. Also, the circuit board 100 is exemplarily employed as the inverter circuit 400. However, the circuit board 100 is not limited to the inverter circuit 400.

The circuit board 100 converts a DC voltage from a non-illustrated electric storage device to AC voltage and outputs the AC voltage to the motor generator 500 based on a driving signal from a control board 300 as an external device. Further, the circuit board 100 converts AC voltage regenerated by the motor generator 500 into DC voltage and outputs the DC voltage to the electric storage device based on the driving signal from the control board 300.

The insulating base material 10 is made of an electrically insulating material. The insulating base material 10 serves to hold components, such as the conductive patterns 20, the interlayer connecting portion 30, the electronic parts (e.g., the IGBTs 41a through 41f and the diodes 42a through 42f), the terminals 61 through 65 and the pads 66, in predetermined positions. The insulating base material 10 also serves to protect the conductive patterns 20, the interlayer connecting portions 30, and the electronic parts 41a through 41f, 42a through 42f embedded therein. In other words, the conductive patterns 20, the interlayer connecting portions 30, and the electronic parts 41a through 41f, 42a through 42f are sealed with the insulating base material 10.

The entirety of the insulating base material 10 has flexibility. That is, the circuit board 100 is a film-shaped flexible (soft) board. Since the entirety of the insulating base material 10 has flexibility, bent portions 70 can be formed without partly reducing the thickness of the insulating base material 10.

Figure 7:
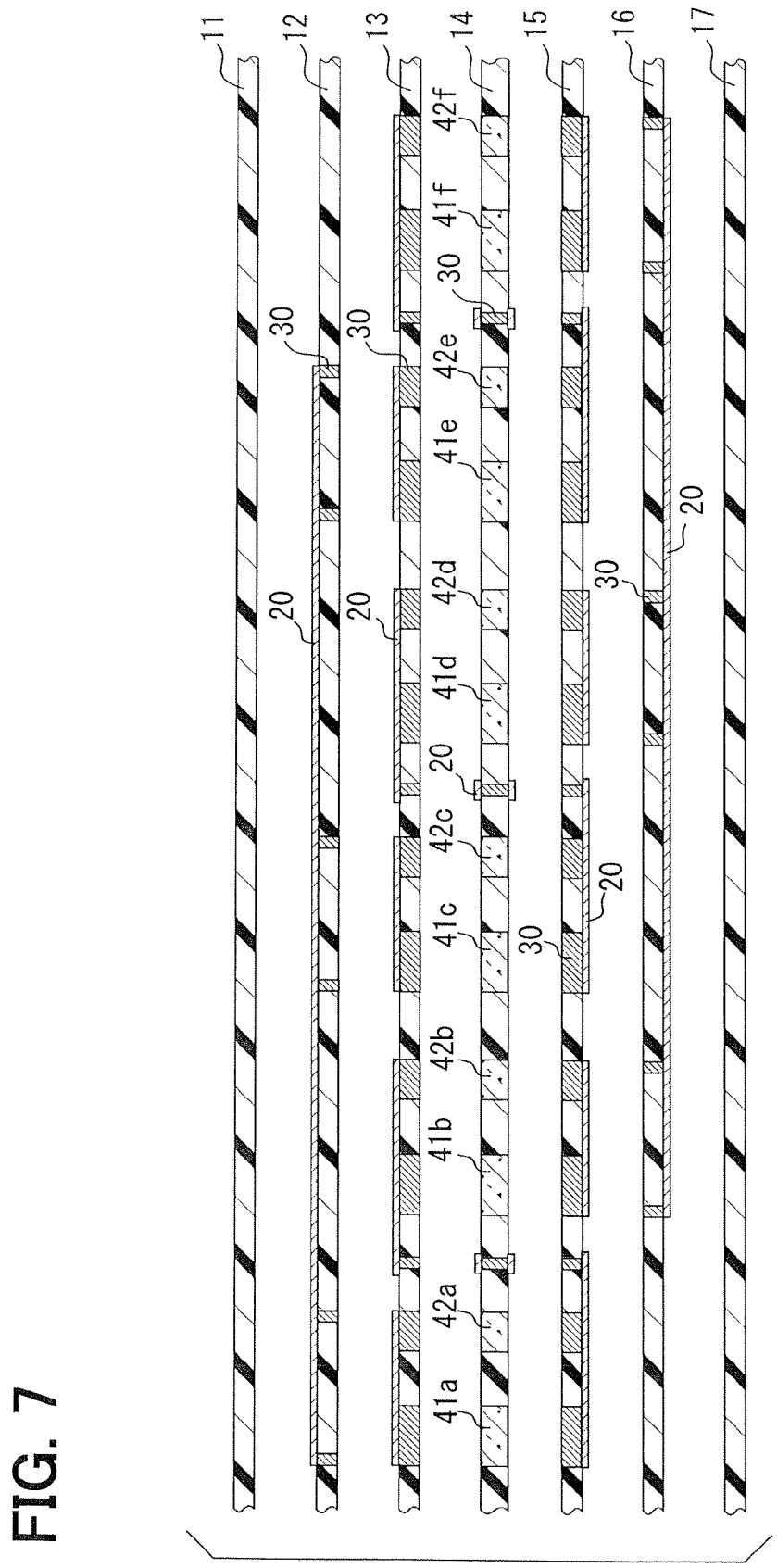
FIG. 7 is an exploded cross-sectional view of the circuit board according to the embodiment.

The insulating base material 10 is mainly made of resin. For example, the insulating base material 10 is made of a stack of base films, such as thermoplastic resin films containing a thermoplastic resin. The thermoplastic resin films are bonded to each other by pressurizing and heating. The thermoplastic resin film is, for example, a film containing an inorganic substance, such as aramid fiber or glass fiber, in addition to the thermoplastic resin. Alternatively, the thermoplastic resin film can be a film without containing the inorganic substance. In the present embodiment, as shown in FIG. 7, the insulating base material 10 is constructed of seven thermoplastic resin films 11 through 17 stacked in a direction in which the thickness of the insulating base material 10 is measured, such as, in an up and down direction of FIG. 7.

A material of the thermoplastic resin films and the number of the thermoplastic resin films, that is, the thickness of the insulating base material 10 are determined so that the insulating base material 10 has a predetermined flexibility. For example, polyamide resin is known as a thermoplastic resin material having flexibility. In a case where electronic parts having the thickness of approximately 0.2 mm are employed as the electronic parts 41a through 41f, 42a through 42f, for example, the circuit board 100 has the thickness of approximately 0.3 mm. In this case, if the insulating base material 10 is made of the polyamide resin, the circuit board 10 has a bending strength of approximately 8 MPa at least in a bending strength test, such as a bending test of JIS K7171:1994 (bending test using a test piece having the thickness of 4 mm, the width of 10 mm, and the length of 80 mm). The cooler 200 has a stacking load of approximately 1 MPa. Therefore, the circuit board 100 has sufficient strength against a load applied to the bent portions 70 when the circuit board 100 is fixed to the cooler 200 by pulling. Here, the stacking load means a load applied to both surfaces of the circuit board 100 when the circuit board 100 is held between tubes 202 of the cooler 200 by pressurizing the cooler 200.

As an example of the thermoplastic resin film 11 through 17, for example, a resin film containing 30 weight % of polyether ketone (PEEK) and 70 weight % of polyetherimide (PEI), without containing an inorganic substance such as glass fiber and an inorganic filler for adjusting a coefficient of linear expansion. However, the material of the thermoplastic resin film is not limited to the above. Further, the ratio of the PEEK and the PEI may be modified. As another example, the thermoplastic resin film 11 through 17 may be made of liquid crystal polymer (LCP), in place of the PEEK and the PEI.

For example, the circuit board 100 can be formed by thermally pressing the thermoplastic resin films 11 through 17 at a time. Such a technique is known as PALAP (Patterned Prepreg Lay Up Process). The PALAP is registered trademark of DENSO CORPORATION. Therefore, as a basic structure and a basic manufacturing method of the circuit board 100, a structure and a manufacturing method relating to the PALAP can be employed. In such a case, since the circuit board 100 is formed at a time, the number of manufacturing process reduces, and a condition that the insulating base material 10 has the flexibility is satisfied.

Next, a manufacturing method of the circuit board 100 will be described with reference to FIG. 7. In FIG. 7, reference number 30 denotes a conductive paste forming the interlayer connecting portion 30. For convenience of illustration and description, the conductive paste is designated with the same reference numeral as the interlayer connecting portion.

First, components for the circuit board 100 are prepared. In the preparation, the conductive patterns 20 (e.g., copper foil) are formed in the thermoplastic resin films 11 through 17 before the thermoplastic resin films 11 through 17 are stacked, as known in the stacking technique of the PALAP. Also, the conductive paste 30 (e.g., Ag—Sn alloy), which becomes the interlayer connecting portion 30 by sintering, is filled in via holes.

Further, through holes having the shape corresponding to the outer shape of the electronic parts 41a through 41f, 42a through 42f are formed in the predetermined number of the thermoplastic resin film depending on the thickness of the electronic parts 41a through 41f, 42a through 42f. In other words, portions to which the electronic parts 41a through 41f, 42a through 42f are to be embedded are cut or removed from the predetermined number of the thermoplastic resin films. In the present embodiment, for example, the through holes are formed in one thermoplastic resin film 14.

At least one of the thermoplastic resin films 11 through 17 has a cutout portion having the shape corresponding to the portion of the terminals 61 through 65 disposed inside of the circuit board 10 at an end thereof. The terminals 61 through 65 are made of metal, such as Fe—Ni alloy or Ni-plated metal. That is, a portion corresponding to the terminals 61 through 65 is cut out or removed from the thermoplastic resin film.

The conductive pattern 20 is formed by patterning a conductive foil attached to the surface of the thermoplastic resin film. Here, the conductive pattern 20 is formed on at least one thermoplastic resin film. As an example, all the thermoplastic resin films have the conductive patterns 20. As another example, a part of or some of the thermoplastic resin films do not have the conductive patterns 20. In the example of FIG. 7, the conductive patterns 20 formed on the thermoplastic resin films 12 through 16 are only illustrated. The conductive pattern 20 is also formed on the thermoplastic resin film 11. The conductive pattern 20 formed on the thermoplastic resin film 11 is provided to form the pads 66. The conductive pattern 20 may be also formed on the thermoplastic resin film 17.

The conductive pattern 20 may be formed only on one surface of the thermoplastic resin film, or on both surfaces of the thermoplastic resin film.

The conductive paste 30 is made by kneading conductive powder with a shape retaining agent such as ethyl cellulose resin and acrylic resin and organic solvent such as terpineol. The via holes are formed in the thermoplastic resin film such as by a carbon oxide laser. The conductive paste is filled in the via holes such as by a screen printing technique. The via hole may be formed at a position corresponding to the conductive pattern 20 so that the conductive pattern 20 forms the bottom of the via hole. Alternatively, the via hole may be formed at a position without corresponding to the conductive pattern 20.

In the case where the via hole is formed at the position corresponding to the conductive pattern 20, the conductive paste 30 can be retained in the via hole due to the conductive pattern 20 serving as the bottom of the via hole. In the case where the via hole is formed at the position without corresponding to the conductive pattern 20 or formed in the thermoplastic resin film without having the conductive pattern 20, a conductive paste as described in Japanese Patent Application Publication No. 2010-123760 can be used as the conductive paste 30 so as to retain the conductive paste 30 within the via hole. In such a case, the conductive paste 30 is, for example, filled in the via hole by an apparatus and a method described in Japanese Patent Application Publication No. 2010-228104.

The conductive paste 30 is provided by adding a low-melting-point room-temperature-solid-state resin to the conductive powder. The low-melting-point room-temperature-solid-state resin decomposes or volatilizes at a temperature lower than a sintering temperature of the conductive powder. Also, the low-melting-point room-temperature-solid-state resin is in a melted state at a temperature lower than the sintering temperature of the conductive powder and higher than room temperature and in a solid state at the room temperature. The low-melting-point room-temperature-solid-state resin is, for example, paraffin.

In the filling, the conductive paste 30 becomes paste due to the low-melting-point room-temperature-solid state resin being melted by heating. After the filling, the conductive paste 30 becomes a solid state due to the low-melting-point room-temperature-solid-state resin being solidified by cooling. As such, the conductive paste 30 can be retained in the via hole. It is to be noted that, in the filling, an end of the via hole is closed by a flat member.

Next, the thermoplastic resin films prepared in the aforementioned manner are stacked. In a stacking step, as shown in FIG. 7, the thermoplastic resin films 11 through 17 are stacked orderly in a condition where the electronic parts 41a through 41f, 42a through 42f are arranged in the through holes. Thus, a stacked body is produced. In this case, electrodes of the electronic parts 41a through 41f, 42a through 42f arranged in the through holes are opposed to the conductive paste 30. Although not illustrated, in the stacking step, the terminals 61 through 65 are arranged in the cutout portions formed at the ends of the thermoplastic resin films. Thus, the portions of the terminals 61 through 65 located at the cutout portions of the thermoplastic resin films are opposed to the conductive paste 30.

Next, the stacked body is heated while applying pressure from both sides of the stacked body using a vacuum thermal pressing machine. In a pressurizing and heating step, the thermoplastic resin films 11 through 17 of the stacked body are heated while applying pressure in an up and down direction, that is, in a stacking direction of the thermoplastic resin films 11 through 17.

In this case, the thermoplastic resin films 11 through 17 are integrated at a time by softening the thermoplastic resin. At this time, the conductive powder of the conductive paste 30 is sintered. Thus, the wiring part is formed by the sintered body of the conductive paste 30 and the conductive patterns 20. Further, the conductive paste 30 and the electrodes of the electronic parts 41a through 41f, 42a through 42f are electrically connected. Moreover, the portions of the terminals 61 through 65 located in the cutout portions are electrically connected to the conductive paste 30.

In the pressurizing and heating step, the insulating base material 10 is formed by integrating the resin films at a time and the conductive powder of the conductive paste 30 is sintered into the sintered body. That is, to integrate the resin films at a time and sinter the conductive powder, the stack of resin films is kept at a temperature equal to or higher than a glass-transition point of the thermoplastic resin of the resin films and equal to or lower than the melting point, under a pressure of several MPa for a predetermined time period. For example, the stack of resin films is kept at a pressing temperature from 280 degrees Celsius to 330 degrees Celsius under a pressure of 4 to 5 Mpa for 5 minutes or over (e.g., ten minutes).

In the pressurizing and heating step, the thermoplastic resin films are connected in the following manner. The stacked thermoplastic resin films 11 through 17 are softened by heating. In this case, since the pressure is being applied, the adjacent thermoplastic resin films 11 through 17 closely contact with each other. As such, the multiple thermoplastic resin films are integrated at a time, and hence the insulating base material 10 is formed.

Portions of the thermoplastic resin films adjacent to the portions of the terminals 61 through 65 disposed at the cutout portions of the thermoplastic resin films are also softened by heating and moves by receiving pressure to closely contact with entire surfaces of the portions of the terminals 61 through 65 at locations other than where the interlayer connecting portion 30 is connected.

In other words, before the pressurizing and heating step, there are clearances between the thermoplastic resin films and the portions of the terminals 61 through 65 disposed at the cutout portions of the thermoplastic resin films. The clearances are filled with the thermoplastic resin films in the pressurizing and heating step. Likewise, the portions of the terminals 61 through 65 disposed in the through holes, such as connecting portions between the terminals 61 through 65 and the interlayer connecting portion 30, are sealed with the thermoplastic resin films. Thus, reliability of connecting improves.

In addition, the thermoplastic resin films adjacent to the electronic parts disposed in the through holes are also softened by heating and moves by receiving the pressure to closely contact with the entire surfaces of the electronic parts other than locations connecting to the interlayer connecting portions 30.

That is, before the pressurizing and heating step, there are clearances between the electronic parts and the thermoplastic resin films. The clearances are filled with the thermoplastic resin films in the pressurizing and heating step. In this way, the electronic parts can be sealed with the thermoplastic resin films. Accordingly, reliability to the electronic parts improves.

Next, connection of the terminals 61 through 65, the conductive patterns 20 and the interlayer connecting portions 30 in the pressurizing and heating step will be described. By the aforementioned heating, tin (Sn) in the conductive paste 30, which has a melting point of 232 degrees Celsius, is melted, and diffused to silver (Ag) powder in the conductive paste 30 to form Ag—Sn alloy having a melting point of 480 degrees Celsius. In this case, since the conductive paste 30 is pressurized, the interlayer connecting portions 30 are formed in the via holes by the alloy integrated by sintering.

Further, the melted tin (Sn) is mutually diffused with copper (Cu) of the conductive paste 20. As such, a metallic diffusion layer, such as a Cu—Sn alloy layer), is formed at a boundary face between the interlayer connecting portion 30 and the conductive pattern 20. The melted tin (Sn) is also mutually diffused with nickel (Ni) of the terminals 61 through 65 or nickel of nickel plating of the terminals 61 through 65. As such, a metallic diffusion layer, such as a Ni—Sn alloy layer, is formed at a boundary face between the interlayer connecting portion 30 and the terminals 61 through 65.

Figure 9:
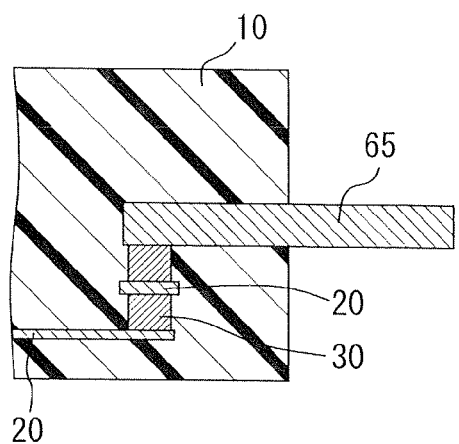
FIG. 9 is a cross-sectional view of a terminal portion of the circuit board according to the embodiment.

In this way, the circuit board 100 shown in FIG. 5 is manufactured at a time. As shown in FIG. 9, the terminal 65 is partly disposed inside of the insulating base material 10 to be electrically connected to the conductive paste 30. The other portion of the terminal 65 projects from the insulating base material 10. In FIG. 9, although only the terminal 65 is illustrated, the remaining terminals 61 through 64 are arranged in the similar manner to the terminal 65.

The insulating base material 10, that is, the circuit board 100 manufactured by the aforementioned method includes multiple embedding portions 40 in which the electronic parts 41a through 41f, 42a through 42f are embedded and multiple bent portions (flexible portions) 70 having flexibility. The bent portions 70 are located between the adjacent embedding portions 40, as shown in FIG. 4. However, the position of the bent portion 70 is not limited between the adjacent two embedding portions 40. That is, in the insulating base material 10, the embedding portions 40 and the bent portions 70 are alternately formed.

Figure 12:
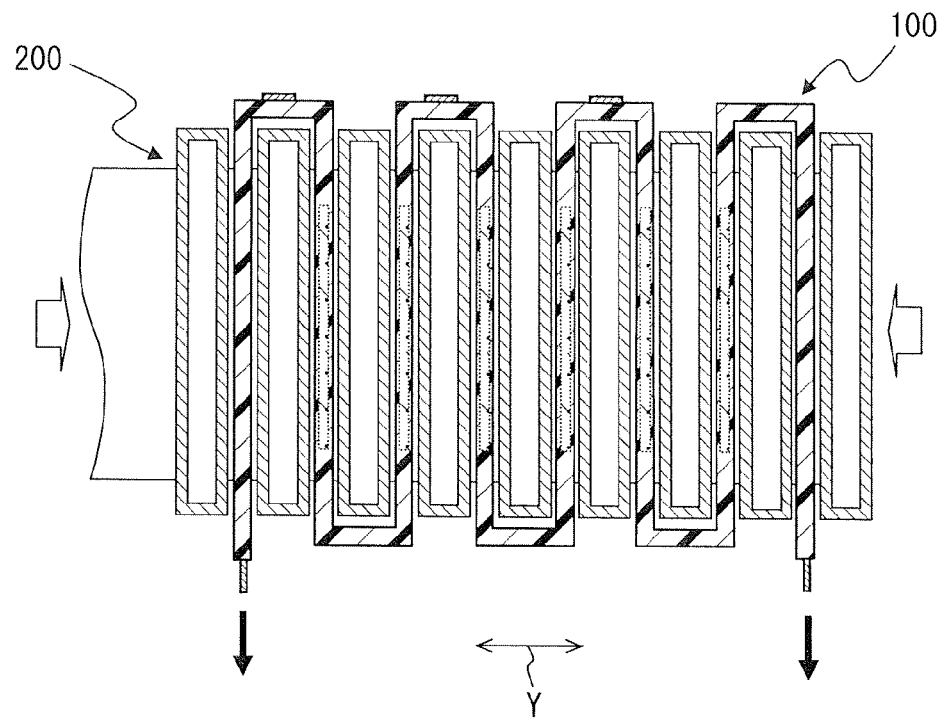
FIG. 12 is a schematic cross-sectional view of the circuit board placed on the cooler according to the embodiment.

The bent portions 70 are bent when the circuit board 100 is fixed to the cooler 200, as shown in FIG. 12. As shown in FIGS. 1 and 2, the bent portions 70 are bent relative to the embedding portions 40 in a state where the circuit board 100 is fixed to the cooler 200.

The number of electronic parts 41a through 41f, 42a through 42f embedded in each embedding portions 40 is not particularly limited. For example, only one electronic part may be embedded in one embedding portion 40. As another example, multiple electronic parts may be embedded in one embedding portion 40.

In the example shown in FIG. 4, in a first embedding portion 40 from the terminals 61, 62, the IGBTs 41a, 41b are embedded. In a second embedding portion 40, the diodes 42a, 42b are embedded. In a third embedding portion 40, the IGBTs 41c, 41d are embedded. In a fourth embedding portion 40, the diodes 42c, 42d are embedded. In a fifth embedding portion 40, the IGBTs 41e, 41f are embedded. In a sixth embedding portion 40, the diodes 42e, 42f are embedded.

In the present embodiment, since the electronic parts 41a through 41f, 42a through 42f are embedded in the insulating base material 10, each of the embedding portions 40 can have flat surfaces on both sides thereof. Therefore, even if the electronic parts 41a through 41f, 42a through 42f are embedded, the embedding portions 40 can be in surface contact with side surfaces 205 of tubes 202 of the cooler 200.

As shown in FIGS. 4 and 9, the terminals 61 through 65, which are electrically connected to the wiring part, project from end surfaces of the insulating base material 10, the end surfaces being at ends of the insulting base material 10 with respect to a longitudinal direction and being parallel to the stacking direction of the thermoplastic resin films 11 through 17, that is, the thickness direction of the insulating base material 10. Specifically, the terminals 61, 62 project from one end surface, and the terminals 63 through 65 project from opposite end surface.

Figure 8:
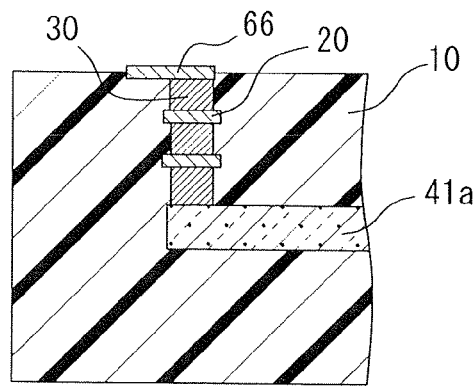
FIG. 8 is a cross-sectional view of a pad portion of the circuit board according to the embodiment.

As shown in FIGS. 4 and 8, the insulating base material 10 is provided with the pads 66. The pads 66 are formed by patterning the conductive foils. The pads 66 are formed on the surface of some of the bent portions 70. The pads 66 serve as terminals to be connected to an external device. For example, each of the pads 66 is constructed of multiple conductive foil portions each having a rectangular shape. The pads 66 are electrically connected to the wiring part. The pads 66 are formed on outer surfaces of the bent portions 70 that are opposite to inner surfaces facing end portions 204 of the tubes 202 in a state where the circuit board 100 is fixed to the cooler 200.

As shown in FIG. 4, the pads 66 are disposed on alternate bent portions 70. In other words, as shown in FIG. 2, the pads 66 are formed on the bent portions 70 that are disposed on the same side of the cooler 200 in the state where the circuit board 100 is fixed to the cooler 200.

In this case, in the state where the circuit board 100 is fixed to the cooler 200, the external device, such as the control board 300, can be easily electrically connected to the circuit board 100 through the pads 66, as compared with a case where the control board 300 is connected to the circuit board 100 through pin-shaped terminals. In other words, in the above configuration, pads 301 of the control board 300 are more easily positioned to the pads 66 than the pin-shaped terminals.

The pads 66 can also serve as marks for positioning when the circuit board 100 is fixed to the cooler 200. Therefore, the electronic parts 41a through 41f, 42a through 42f can be accurately positioned to fixing portions of the cooler 200.

In the present embodiment, the terminal 61 is a supply terminal, and the terminal 62 is a ground terminal. Also, the terminal 63 is a U-phase terminal, the terminal 64 is a V-phase terminal and a terminal 65 is a W-phase terminal. Further, the pads 66 are control signal terminals.

Figure 10:
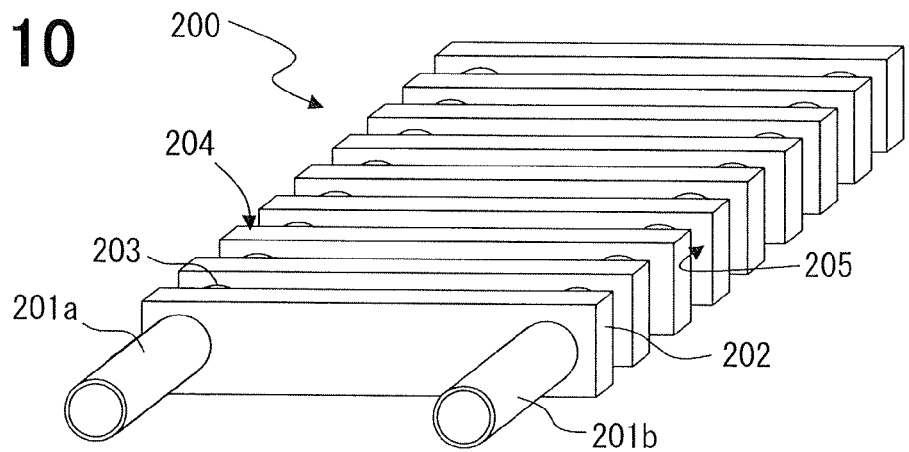
FIG. 10 is a perspective view of the cooler according to the embodiment.
Figure 11:
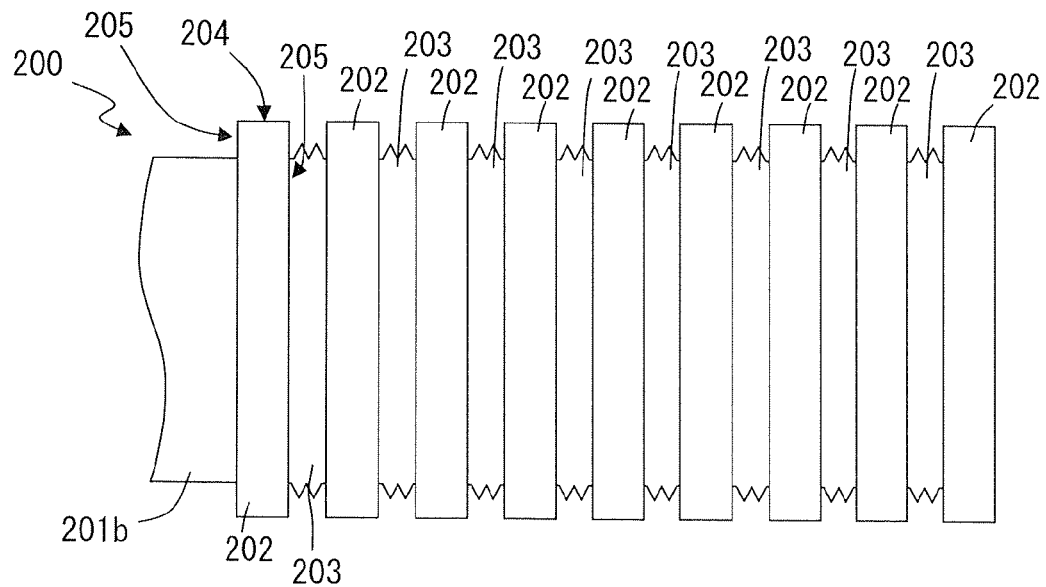
FIG. 11 is a schematic side view of the cooler according to the embodiment.

Next, a structure of the cooler 200 will be described. As shown in FIGS. 10, 11, the cooler 200 includes an inlet pipe 201a, an outlet pipe 201b, the multiple tubes 202, coupling members 203 coupling between the tubes 202. For example, a cooler described in Japanese Patent No. 4140549 can be employed as the cooler 200.

The multiple tubes 202 serve as the fixing parts to which the circuit board 100 is fixed. The tubes 202 are made of aluminum. The tubes 202 form refrigerant passages 202a through which refrigerant flows therein. The tubes 202 are arranged at equal intervals in a direction. Hereinafter, the direction in which the tubes 202 are arranged, that is, a right and left direction in FIG. 2 is referred to as a tube arrangement direction or a Y direction. The refrigerant flows through the refrigerant passages 202a in the lengthwise direction of the tubes 202. Hereinafter, the flow direction of the refrigerant in the tubes 202 is also referred to as an X direction. The X direction corresponds to a right and left direction in FIG. 1. The end portions 204 of the tubes 202 to which the bent portions 70 of the circuit board 100 is fixed are disposed on a plane including the X direction and the Y direction. That is, the end portions 204 are located at ends of the tubes 202 with respect to a Z direction that is perpendicular to the X direction and the Y direction. The Y direction also corresponds to a first direction, and the Z direction also corresponds to a second direction. The tubes 202 have side surfaces 205 that are perpendicular to the Y direction.

The coupling members 203 are made of aluminum. As shown in FIG. 11, the coupling members 203 are bellows pipes, and form therein refrigerant passages through which the refrigerant flows. The coupling members 203 are disposed between the adjacent tubes 202 to allow communication between the adjacent tubes 202. The coupling members 203 are capable of expanding and contracting in the Y direction.

Ends of the coupling members 203 are inserted to and bonded with insertion holes of the adjacent two tubes 202. The embedding portions 40 of the circuit board 100 are held between the tubes 202 utilizing the expansion and contraction of the coupling members 203. That is, the embedding portions 40 are interposed between the tubes 202.

The refrigerant is introduced in the cooler 200 from the inlet pipe 201a, and is discharged from the cooler 200 through the outlet pipe 201b. The inlet pipe 201a and the outlet pipe 201b are made of aluminum. The inlet pipe 201a and the outlet pipe 201b are brazed with the tube 202 that is located at an end with respect to the Y direction. The inlet pipe 201a and the outlet pipe 201b are connected to a pump for circulating the refrigerant and a heat exchanger for cooling the refrigerant. As the refrigerant, for example, water containing ethylene glycol-base anti-freezing liquid is employed.

The refrigerant flows in the cooler 200 through the inlet pipe 201a. The refrigerant flows out from the cooler 200 after passing through the refrigerant passages 202a in the tubes 202 and the coupling members 203.

Next, the fixing structure of the circuit board 100 to the cooler 200 will be described. As shown in FIGS. 1 and 2, the circuit board 100 is fixed to the cooler 200 in a winding manner. Specifically, the circuit board 100 is wound around the tubes 202.

For example, the circuit board 100 is fixed to the cooler 200 such that the bent portions 70 are opposed to the end portions 204 of the tubes 202. One bent portion 70 and an adjacent bent portion 70 are disposed on opposite end portions 204 of the adjacent tubes 202. In this case, therefore, three or more embedding portions 40 can be disposed between the tubes 202.

It is preferable that the bent portions 70 are closely in contact with the end portions 204 of the tubes 202 along the shape of the end portions 204. For example, the bent portions 70 have the shape corresponding to the shape of the end portions 204. In such a case, the embedding portions 40 are easily positioned relative to the tubes 202, as compared with a case where clearances remain between the bent portions 70 and the end portions 204 of the tubes 202.

The embedding portions 40 are held by the adjacent tubes 202, and both surfaces of the embedding portions 40 are closely in contact with the tubes 202. That is, the embedding portion 40 is disposed between the side surfaces 205 of the tubes 202 that are opposed in the Y direction. Both surfaces of the embedding portion 40 are closely in contact with the opposed side surfaces 205. The embedding portion 40 is held in a condition that both surfaces thereof entirely make surface contact with the opposed side surfaces 205 of the adjacent tubes 202 by receiving stress from the adjacent tubes 202. In this case, therefore, the electronic parts 41a through 41f, 42a through 42f are opposed to the side surfaces 205 of the tubes 202 through the insulating base material 10.

Therefore, it can be said that the embedding portion 40 is a portion embedding the electronic parts 41a through 41f, 42a through 42f therein and being held by the adjacent tubes 202 such that both surfaces thereof are closely in contact with the side surfaces 205. Also, it can be said that the bent portion 70 is a portion being integral with the adjacent embedding portions 40 and disposed to oppose the end portion 204 that is located between the adjacent embedding portions 40.

The circuit board 100 includes end portions 400 between the end surfaces of the insulating base material 10 from which the terminals 61 through 65 projects and the end bent portions 70, as shown in FIG. 4. Although the electronic parts 41a through 41f, 42a through 42f are not embedded in the end portions 400, the end portions 400 may be also held between the tubes 202 such that both surfaces of the end portions 400 are closely in contact with the side surfaces 205 of the tubes 202, as shown in FIG. 2.

The terminals 61 through 65 are disposed to project from the end surfaces of the insulating base material 10 in the lengthwise direction. Thus, in the state where the circuit board 100 is fixed to the cooler 200, the terminals 61 through 65 extend in the Z direction. Further, the terminals 61 through 65 project more to the outside than the end portions 204 of the tubes 202 in the Z direction. In FIG. 2, because the terminal 61 is located behind the terminal 62 and the terminals 63, 64 are located behind the terminal 65, only the terminals 62, 65 are illustrated.

Figure 3:
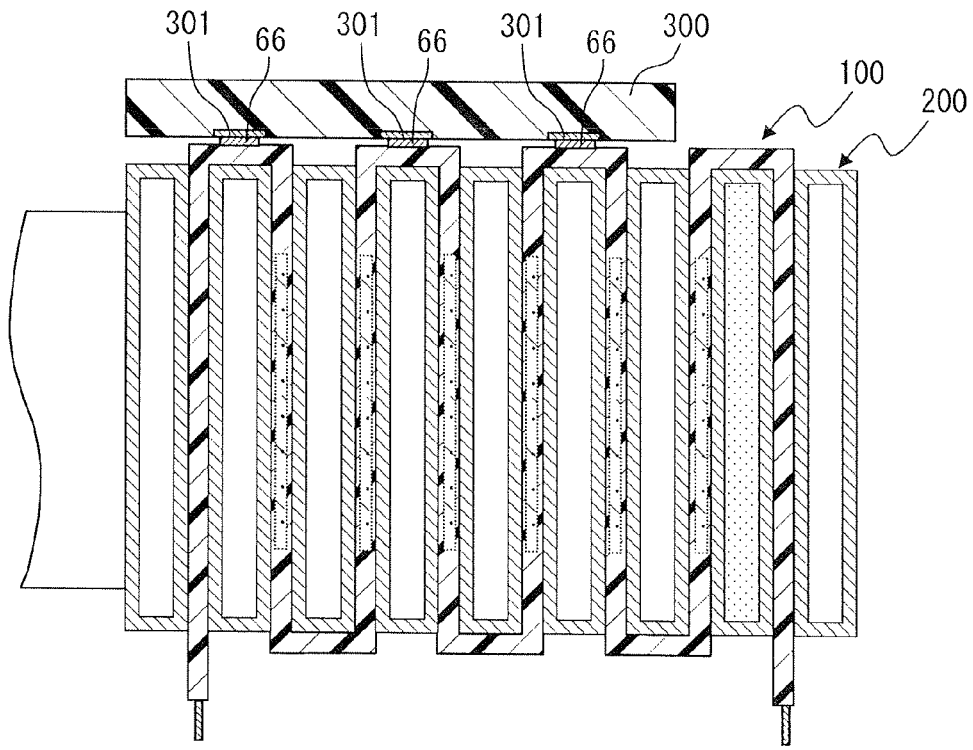
FIG. 3 is a cross-sectional view of the fixing structure in which a control board is fixed to the circuit board according to the embodiment.

The pads 66 are disposed on alternate bent portions 70. Therefore, in the state where the circuit board 100 is fixed to the cooler 200, the pads 66 are located on the same side of the tubes 202 with respect to the Z direction, such as on an upper side in FIG. 2. As shown in FIG. 3, therefore, when the control board 300 is disposed on the side of the cooler 200 to which the circuit board 100 is fixed, the pads 301 of the control board 300 are electrically connected to the pads 66 of the circuit board 100. Namely, the control board 300 can be easily connected to the circuit board 100 fixed to the cooler 200.

In the aforementioned fixing structure, the embedding portions 40 in which the electronic parts, such as the IGBTs 41a through 41f and the diodes 42a through 42f, are embedded are held between the tubes 202, and there is no air spaces between the electronic parts 41a through 41f, 42a through 42f and the tubes 202. Accordingly, the electronic parts 41a through 41f, 42a through 42f located between the tubes 202 are cooled from both sides thereof. Thus, cooling efficiency improves.

The circuit board 100 is held by the tubes 202. Therefore, it is not necessary to additionally form engagement portions. Further, it is less likely that the electronic parts 41a through 41f, 42a through 42f will be displaced after the circuit board 100 is fixed to the cooler 200.

The circuit board 100 is fixed to the cooler 200 such that the embedding portions 40 are stressed from the tubes 202. Therefore, contact between the embedding portions 40 and the tubes 202 improve.

Although the circuit board 100 receives stress from the tubes 202, since the electronic parts 41a through 41f, 42a through 42f are embedded in the insulating base material 10, it is less likely that the stress will concentrate on the electronic parts 41a through 41f, 42a through 42f.

In the circuit board 100, the electronic parts 41a through 41f, 42a through 42f and the wiring part including the conductive patterns 20 and the interlayer connecting portions 30 are integrally embedded within the insulating base material 10. Therefore, it is not necessary to consider creeping distances between the wirings, as compared with a structure in which the wiring part is exposed. As such, the size of the fixing structure can be reduced. Further, because it is not necessary to connect arms using bus-bars or the like, parasitic inductance reduces.

In the present embodiment, the electronic parts 41a through 41f, 42a through 42f are exemplarily disposed only in the embedding portions 40 that are held between the tubes 202. However, the fixing structure is not limited to such a configuration.

For example, the electronic parts 41a through 41f, 42a through 42f may be disposed in the bent portions 70. In such a case, the end portions 204 of the tubes 202 need to have a shape that does not affect the property of the electronic parts even if the electronic parts disposed in the bent portions 70 are deformed. For example, in a case where the end portion 204 has a curved shape, it is necessary to adjust the curvature so that the property of the electronic parts is not affected.

Also, it is necessary to adjust the positions of the electronic parts so that the electronic parts are not deformed or not affected even if deformed when the circuit board 100 is fixed to the cooler 200. For example, it is necessary to fix the circuit board 100 to the cooler 200 such that the electronic parts are opposed to flat portions of the end portions 204.

Next, a fixing method of the circuit board 100 to the cooler 200 will be described. Referring to FIG. 12, the circuit board 100 is arranged to the cooler 200. The circuit board 100 is bent at the bent portions (flexible portion) 70, and is disposed such that the bent portions 70 are opposed to the end portions 204 of the tubes 202 and the embedding portions 40 are located between the adjacent tubes 202. Further, opposite ends of the circuit board 100 are pulled in the Z direction, as shown by solid arrows in FIG. 12, so that the bent portions 70 are brought into close contact with the end portions 204 along the shape of the end portions 204, and the embedding portions 40 are received in the adjacent tubes 202.

In the present embodiment, the pulling step of pulling the ends of the circuit board 100 for bringing the bent portions 70 into contact with the end portions 204 is exemplarily employed. However, the fixing method is not limited to the above. It is not always necessary to make the bent portions 70 closely in contact with the end portions 204 along the shape of the end portions 204.

After the aforementioned arranging step, pressure is applied to the cooler 200 and the insulating base material 10. For example, pressure is applied to opposite ends of the cooler 200 with respect to the Y direction, as shown by blank arrows in FIG. 12. In this case, as the coupling members 203 are compressed, that is, deformed, the side surfaces 205 of the tubes 202 are brought into contact with both the surfaces of the embedding portions 204. Thus, the embedding portions 40 are held by the tubes 202. In the present embodiment, since the coupling members 203 have the bellows shape, the embedding portions 40 are held between the adjacent tubes 202 by the above pressing step.

Accordingly, the electronic parts 41a through 41f, 42a through 42f are held between the tubes 202 without remaining air spaces between the electronic parts 41a through 41f, 42a through 42f and the tubes 202. Further, the electronic parts 41a through 41f, 42a through 42f can be cooled from both sides thereof. Therefore, the cooling efficiency improves.

In the aforementioned pressing step, the embedding portions 40 are brought into close contact with the tubes 202, and hence the circuit board 100 is held by the tubes 202. That is, the above fixing structure improves the contact between the tubes 202 and the embedding portions 40. Therefore, positioning of the circuit board 100 to the cooler 200 improves as well as displacement of the electronic parts 41a through 41f, 42a through 42f after the circuit board 100 is fixed to the cooler 200 reduces, without requiring additional engagement portions.

In the aforementioned fixing method, the bent portions 70 are brought into contact with the end portions 204 of the tubes 202 and the embedding portions 40 are arranged between the tubes 202 by pulling the ends of the circuit board 100. In this case, the embedding portions 40 are positioned relative to the tubes 202 without requiring additional engagement portions. That is, the electronic parts 41a through 41f, 42a through 42f are easily positioned relative to the cooler 200.

In such a case, the pads 66 can be used as the marks for positioning the circuit board 100 relative to the cooler 200. Therefore, the electronic parts 41a through 41f, 42a through 42f are accurately arranged between the tubes 202.

(First Modification)

A first modification will be described hereinafter with reference to FIG. 13. In modifications described hereinafter, only structures modified from the exemplary embodiment will be described.

Figure 13:
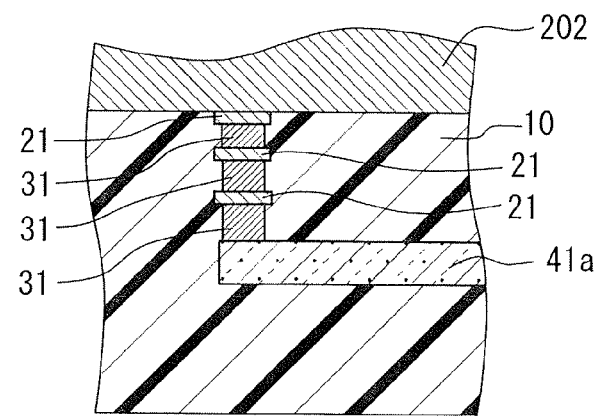
FIG. 13 is a cross-sectional view of a part of a circuit board with embedded electronic parts according to a first modification of the present invention.

As shown in FIG. 13, for example, the circuit board 100 includes heat radiating conductive patterns 21 and heat radiating interlayer connecting portions 31 as a heat radiating connecting part. The heat radiating conductive patterns 21 and the heat radiating interlayer connecting portions 31 are made of metal. The heat radiating conductive patterns 21 and the heat radiating interlayer connecting portions 31 are not electrically connected to the electronic parts 41a through 41f, 42a through 42f, but mechanically connected to the electronic parts 41a through 41f, 42a through 42f. Further, a portion of the heat radiating connecting part, such as the heat radiating conductive pattern 21, is exposed from the insulating base material 10 to be closely in contact with the tube 202. In this case, the cooling efficiency further improves.

The heat radiating conductive patterns 21 and the heat radiating interlayer connecting portions 31 can be made of the similar material and by the similar method to the conductive patterns 20 and the interlayer connecting portions 30. In FIG. 13, only the heat radiating conductive patterns 21 and the heat radiating interlayer connecting portions 31 for connecting the IGBT 41a and the tube 202 are illustrated. The heat radiating conductive patterns 21 and the heat radiating interlayer connecting portions 31 are provided for other electronic parts 41b through 41f, 42a through 42f in the similar manner.

(Second Modification)

A second modification will be described hereinafter with reference to FIG. 14.

As shown in FIG. 14, a circuit board 101 has a similar structure to the circuit board 100 except bent portions 71. That is, the bent portions 71 have the thickness smaller than the other portions of the insulating base material 10, such as the adjacent embedding portions 40. For example, the circuit board 101 has recesses on both surfaces at positions corresponding to the bent portions 71. Thus, the thickness of the circuit board 101 is reduced at the bent portions 70. In the example of FIG. 14, the recesses are formed on both surfaces of the circuit board 101. Alternatively, the bent portion 71 may be formed by forming the recess only on one side of the circuit board 101.

To form the bent portions 71, that is, to form the recesses, through holes are formed in the thermoplastic resin film forming the surface of the insulating base material 10 at locations where the bent portions 71 are to be formed. Depending on the depth of the recesses, the through holes are formed in the predetermined number of thermoplastic resin films. That is, the recesses are formed by reducing the number of the thermoplastic resin films at the locations corresponding to the bent portions 71. Alternatively, the recesses can be formed by arranging the thermoplastic resin film forming the surface of the insulating base material 10 or the predetermined number of the thermoplastic resin films from the surface of the insulating base material 10 only at locations other than the bent portions 71.

In such a case, the bent portions 71 are easily provided with flexibility, and hence the circuit board 101 is easily bent at the bent portions 71. It is not always necessary that the entirety of the circuit board 10 has flexibility. That is, it is not always necessary that portions other than the bent portions 71, such as the embedding portions 40, have flexibility. By reducing the thickness of the circuit board 101 at the bent portions 71, only the bent portions 71 can have the flexibility.

In the case where the circuit board 101 has the recesses at the bent portions 71, the end portions 204 of the tubes 202 are properly disposed in the recesses when the circuit board 101 is fixed to the cooler 200. Thus, the positioning of the circuit board 101 relative to the cooler 200 improves. In such a case, it is preferable that the recesses have a shape corresponding to the shape of the end portions 204 of the tubes 202.

(Third Modification)

A third modification will be described hereinafter with reference to FIG. 15.

As shown in FIG. 15, a circuit board 102 has bent portions 72. In the circuit board 102, only the bent portions 72 have flexibility, and the other portions do not have flexibility. In this case, the option of resin materials disposed on both sides of the electronic parts 41*a* through 41*f,* 42*a* through 42*f* increases. Therefore, resin having a favorable property of heat radiation can be selected for the material of the embedding portions 40.

For example, the circuit board 102 can be formed such that only the portions opposing to the electronic parts 41*a* through 41*f,* 42*a* through 42*f* do not have flexibility. In such a case, recesses may be formed at locations opposing to the electronic parts 41*a* through 41*f,* 42*a* through 42*f* by a similar method to the recesses of the second modification, and a material having favorable heat radiation may be embedded in the recesses.

(Fourth Modification)

A fourth modification will be described hereinafter with reference to FIG. 16.

As shown in FIG. 16, a circuit board 103 is provided with heat radiating members (heat sinks) 80. The heat radiating members 80 are made of metal, such as copper foils, and have flexibility. The heat radiating members 80 provide opposite surface layers of the embedding portions 40.

For example, the heat radiating members 80 are continuously formed from the surfaces of the embedding portions 40 to the surfaces of the bent portions 70. The heat radiating member 80 are partly removed at locations corresponding to the pads 66. Thus, the pads 66 are exposed from the heat radiating member 80.

In such a case, since the contact area between the heat radiating members 80 and the tubes 202 increases, the cooling efficiency further improves.

In the case where the circuit board 103 have the heat radiating members 80, the circuit board 103 may further have a heat radiating connecting part that is made of metal and mechanically connected to the electronic parts 41*a* through 41*f,* 42*a* through 42*f* without being electrically connected to the electronic parts 41*a* through 41*f,* 42*a* through 42*f*. As an example of the heat radiating connecting part, the heat radiating conductive patterns 21 and the heat radiating interlayer connecting portions 31 similar to the first modification can be employed.

Accordingly, the cooling efficiency further improves.

(Fifth Modification)

A fifth modification will be described hereinafter with reference to FIG. 17.

It is not always necessary that portions of the circuit board other than the bent portions 70, such as the embedding portions 40, have the flexibility. As shown in FIG. 17, therefore, a circuit board 104 has heat radiating members 82 without having flexibility as opposite surface layers of the embedding portions 40 and heat radiating members 81 having the flexibility as opposite surface layers of the bent portions 70. For example, the heat radiating members 82 are made of a copper plate, and the heat radiating members 81 are made of a copper foil.

In such a case, since the heat radiating member 82 need not to have flexibility, a heat radiating member having favorable heat radiation property is selected as the heat radiating member 82. Therefore, the cooling efficiency improves. That is, since the option of the material of the heat radiating member 82 increases, a material having favorable heat radiation property, such as heat transmission property, can be selected.

Also in the fifth modification, similar to the fourth modification, the circuit board 104 can have the heat radiating connecting part that is made of metal and mechanically connected to the electronic parts 41*a* through 41*f,* 42*a* through 42*f* without being electrically connected to the electronic parts 41*a* through 41*f,* 42*a* through 42*f*. Thus, the cooling efficiency further improves.

In the example shown in FIG. 17, although the circuit board 104 has the heat radiating members 81 at the bent portions 70 in addition to the heat radiating members 82 of the embedding portions 40, such a structure may be modified. For example, the circuit board 104 may not have the heat radiating members 81 at the bent portions 70. Also in such a case, the similar advantageous effect can be achieved.

(Sixth Modification)

A sixth modification will be described hereinafter with reference to FIGS. 18 and 19.

Figure 18:
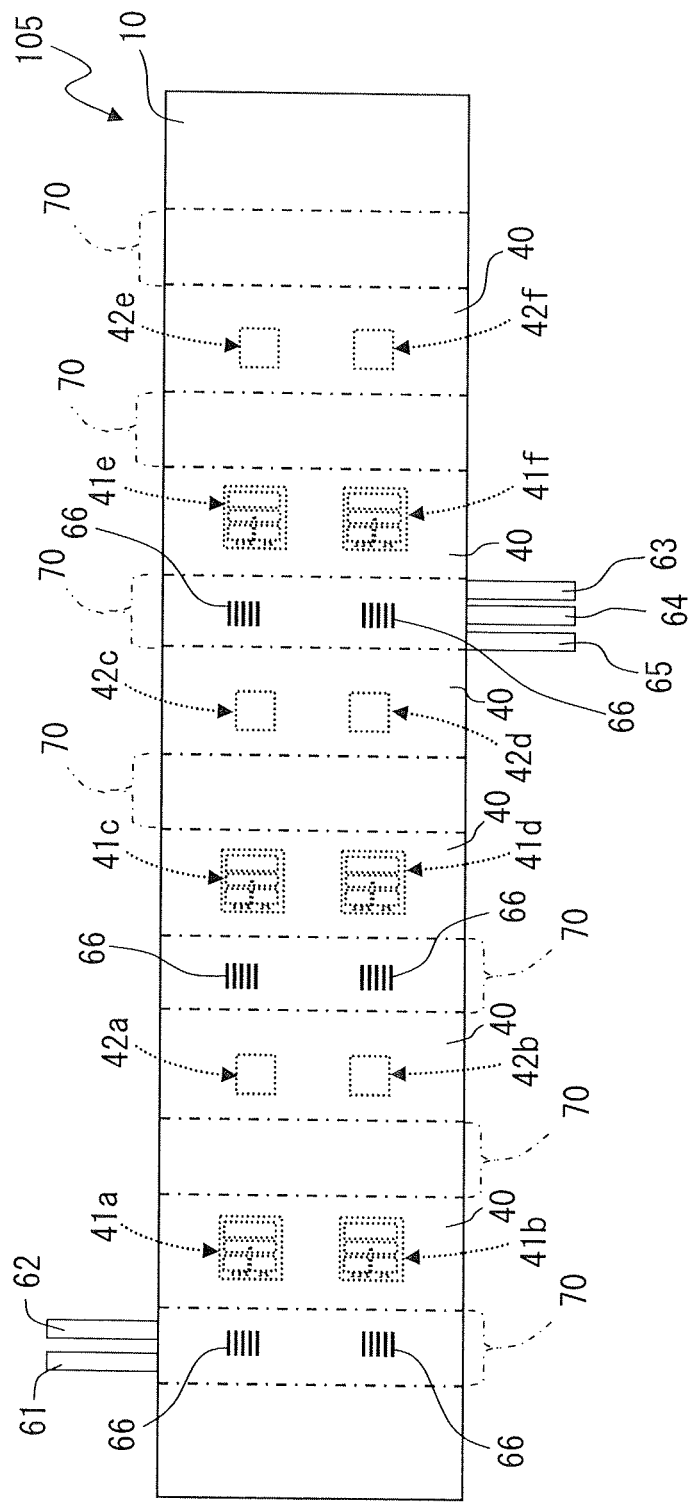
FIG. 18 is a plan view of a circuit board with embedded electronic parts according to a sixth modification of the present invention.

As shown in FIG. 18, the terminals 61 through 65 may project from the insulating base material 10 in a direction perpendicular to the lengthwise direction of a circuit board 105 before the circuit board 105 is fixed to the cooler 200. In such a case, the terminals 61 through 65 project in the X direction, corresponding a right and left direction in FIG. 19 in a state where the circuit board 105 is fixed to the cooler 200.

Specifically, the terminals 61, 62 project from a first longitudinal surface of the insulating base material 10, and the terminals 63 through 65 project from a second longitudinal surface of the insulating base material 10. The first longitudinal surface and the second longitudinal surface are located on opposite sides of the circuit board 105 with respect to the X direction. In the state where the circuit board 105 is fixed to the cooler 200, the terminals 61 through 65 project from the first and second longitudinal surfaces of the insulating base material 10 with respect to the X direction.

Figure 19:
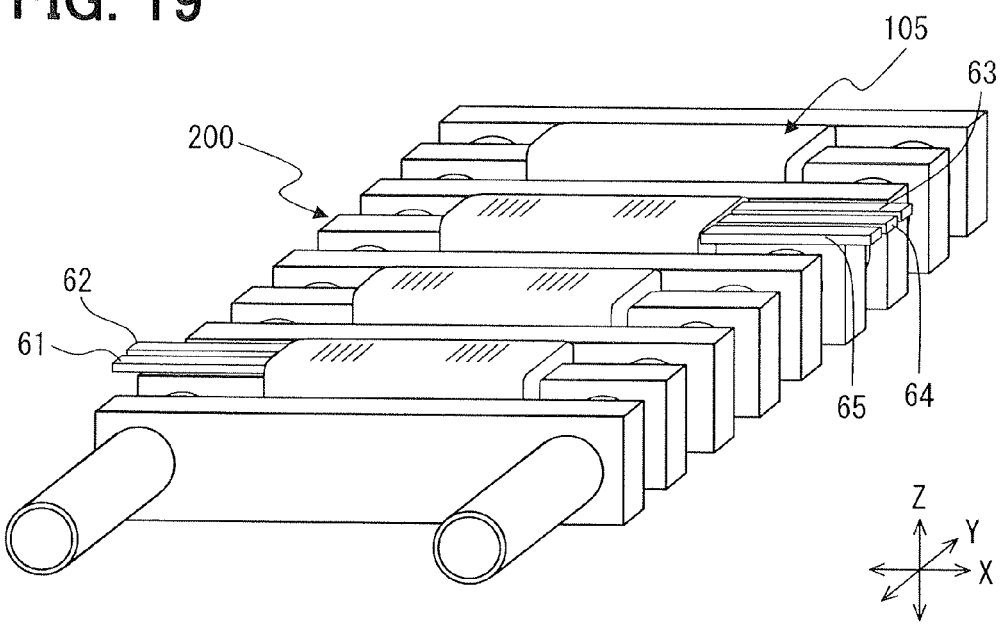
FIG. 19 is a perspective view of a fixing structure of the circuit board to a cooler according to the sixth modification.

As shown in FIG. 19, in the state where the circuit board 105 is fixed to the cooler 200, the coupling members 203 are disposed on opposite sides of the embedding portions 40 with respect to the X direction. Therefore, the terminals 61 through 65 are disposed to project from the side surfaces of the bent portions 70.

Accordingly, the terminals 61 through 65 can be arranged to project in any directions from the insulating base material 10. Therefore, arrangement flexibility of the fixing structure, for example, arrangement in a vehicle improves. That is, the fixing structure is adaptable to any loading environments, such as any mounting environments in vehicles.

Similar to the terminals 61 through 65, the pads 66 can be provided on any sides of the cooler 200 with respect to the Z direction.

(Seventh Modification)

A seventh modification will be described hereinafter with reference to FIG. 20.

Figure 20:
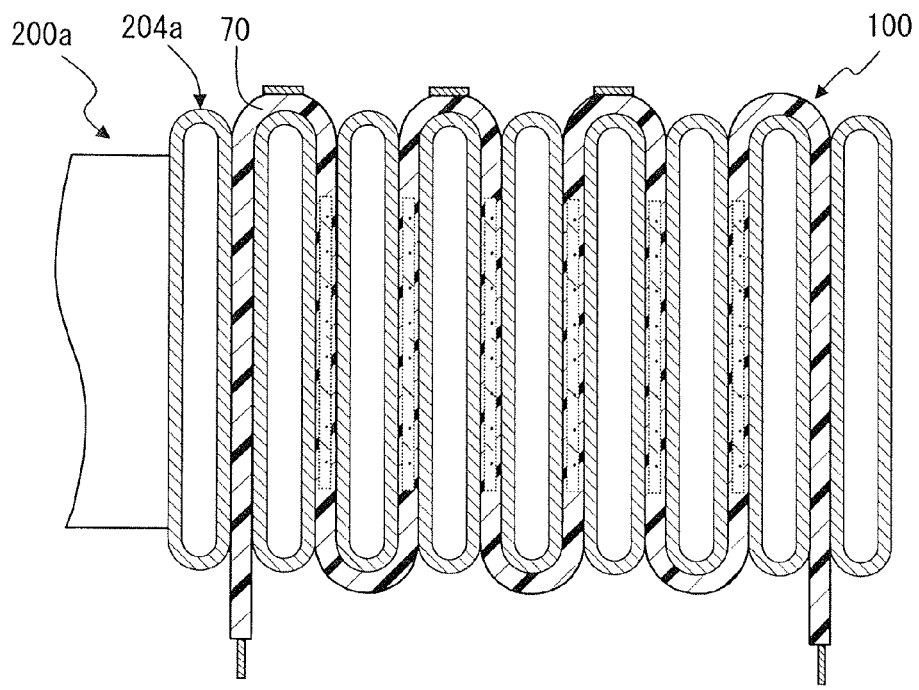
FIG. 20 is a cross-sectional view of a circuit board with embedded electronic parts fixed to a cooler according to a seventh modification of the present invention.

As shown in FIG. 20, a cooler 200*a* has tubes 202 having curved end portions 204*a*, for example. In such a case, stress to the boundary faces between the embedding portions 40 and the bent portions 70, that is, portions bent to form the bent portions 70 can be reduced. Further, stress to the conductive patterns 20 and the interlayer connecting portions 30 located at the boundary faces between the embedding portions 40 and the bent portions 70 can be reduced.

Moreover, even if the electronic parts are arranged at the boundary faces between the embedding portion 40 and the bent portions 70, the stress to the electronic parts can be reduced.

(Eighth Modification)

An eighth modification will be described hereinafter with reference to FIG. 21.

Figure 21:
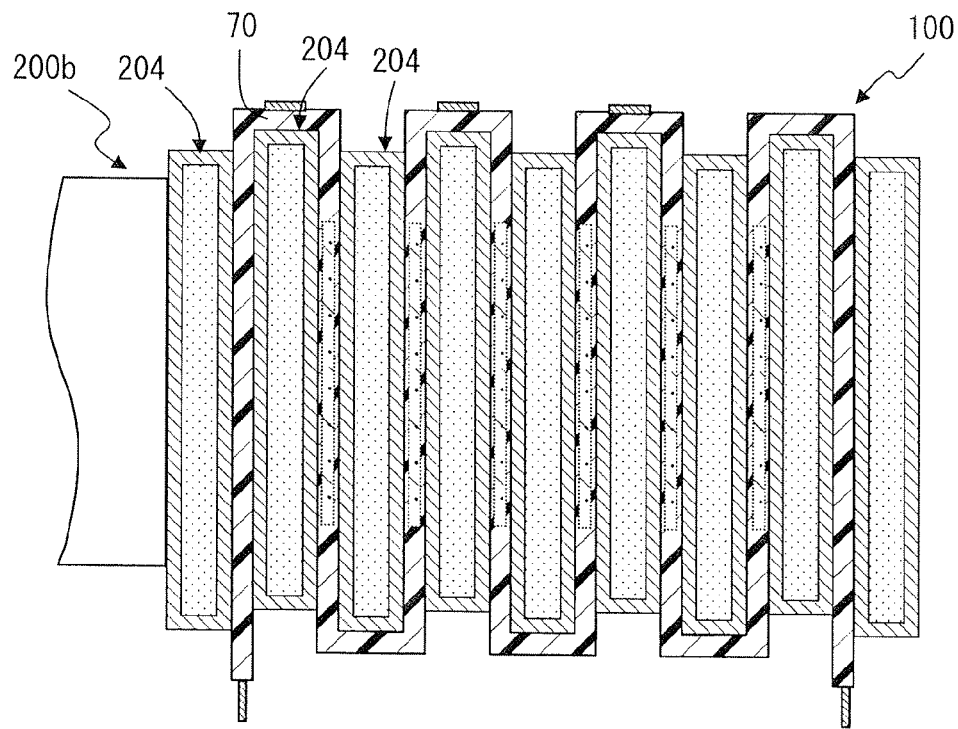
FIG. 21 is a cross-sectional view of a circuit board with embedded electronic parts fixed to a cooler according to an eighth modification of the present invention.

As shown in FIG. 21, a cooler 200*b* have tubes 202 staggered in the Z direction. Specifically, the end portions 204 on which the bent portions 70 are fixed are projected more to outside than the end portions 204 on which the bent portions 70 are not fixed. In such a case, when the control board 300 is connected to the pads 66, the end portions 204 on which the bent portions 70 are not fixed do not interfere with the connection between the control board 300 and the pads 66. That is, first, third, fifth seventh and ninth tubes 202 from the left side in FIG. 21 do not interfere with the control board 300. Accordingly, the control board 300 is more easily and properly connected to the circuit board 100.

(Ninth Modification)

A ninth modification will be described hereinafter with reference to FIGS. 22 through 24.

Figure 22:
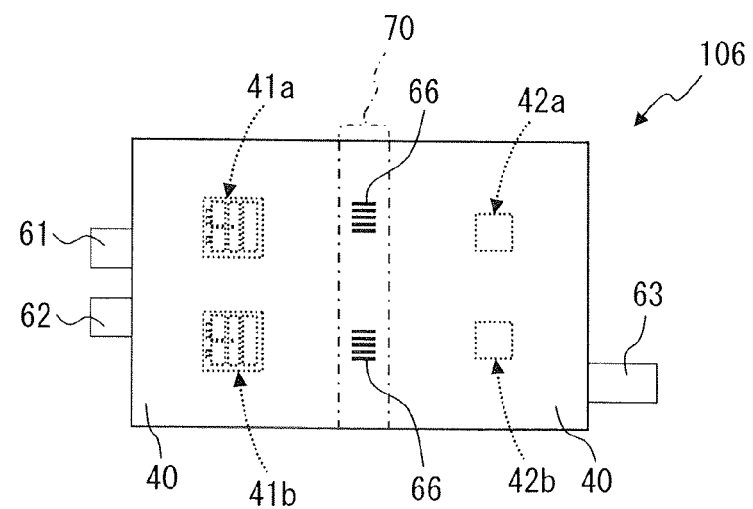
FIG. 22 is a plan view of a circuit board with embedded electronic parts according to a ninth modification of the present invention.

As shown in FIG. 22, a circuit board 106 has one bent portion 70 and two embedding portions 40 on opposite sides of the bent portion 70. In the aforementioned embodiment and modifications, the circuit board 100, 101, 102, 103, 104, 105 is configured as 6in1Package in which the U-phase arm, the V-phase arm and the W-phase arm are integrated. In the ninth modification, on the other hand, the circuit board 106 is configured as 2in1Package.

The circuit board 106 of FIG. 22 provides the U-phase arm, for example. Because the V-phase arm and the W-phase arm have similar structure to the U-phase arm shown in FIG. 22, illustration and description thereof are omitted.

Figure 23:
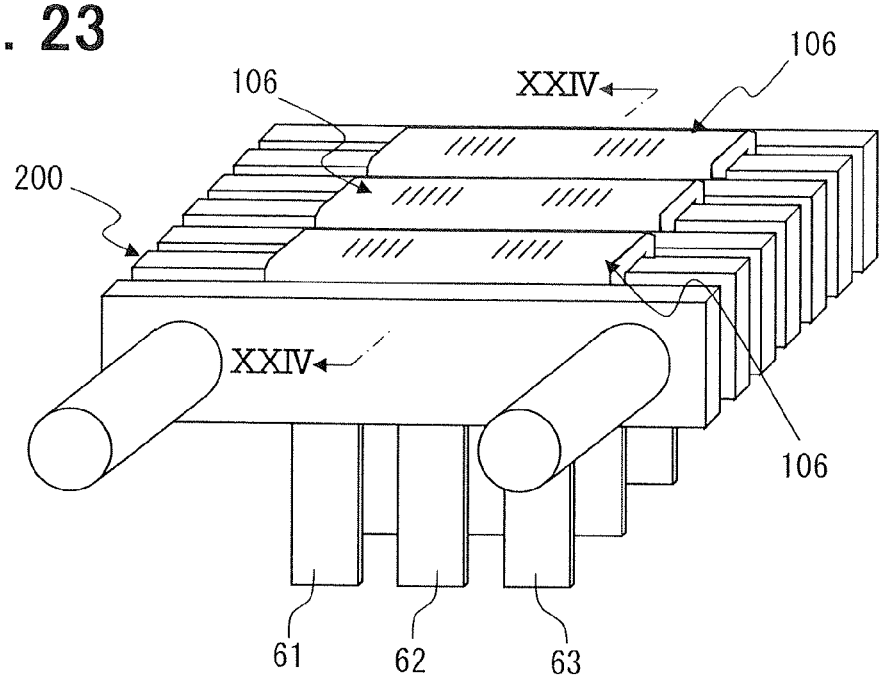
FIG. 23 is a perspective view of a fixing structure of the circuit board to a cooler according to the ninth modification.
Figure 24:
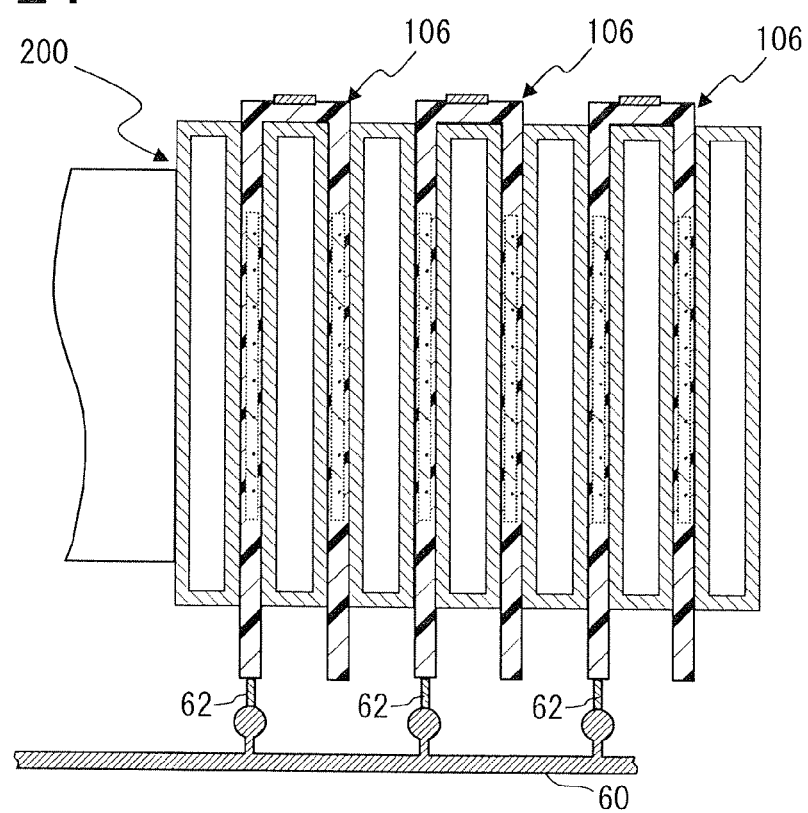
FIG. 24 is a cross-sectional view taken along a line XXIV-XXIV in FIG. 23.

As shown in FIGS. 23 and 24, multiple circuit boards 106, such as three circuit boards, are fixed to the cooler 200. Also in this case, the circuit boards 106 are fixed such that the bent portions 70 are opposed to the end portions 204 of the tubes 202. In each of the circuit boards 106, the embedding portions 40 are held between the adjacent tubes 202 such that both the surfaces of the embedding portions 40 are closely in contact with the tubes 202. Specifically, each of the embedding portions 40 is disposed between the opposed side surfaces 205 of the tubes 202, and both the surfaces of the embedding portion 40 are closely in contact with the side surfaces 205. In this way, both the surfaces of the embedding portion 40 are entirely in surface contact with the side surfaces 205 of the opposed tubes 202, and in pressure contact with the side surfaces 205.

Further, the circuit boards 106 are fixed to the cooler 200 such that the bent portions 70 are located on the same side of the cooler 200 with respect to the Z direction. Therefore, the pads 66 are located on the same side of the cooler 200 in the state where the circuit boards 106 are fixed to the cooler 200. As such, the pads 301 of the control board 300 are easily electrically connected to the pads 66 of the circuit boards 106. Namely, the control board 300 is easily connected to the circuit boards 106 fixed to the cooler 200. Also in the ninth modification, the advantageous effects similar to the aforementioned embodiment can be achieved.

The terminals 61 of the circuit boards 60 are connected to each other through a bus-bar 60. Likewise, the terminals 62 of the circuit boards 60 are connected to each other through another bus-bar 60.

(Tenth Modification)

A tenth modification will be described hereinafter with reference to FIGS. 25 and 26.

Figure 25:
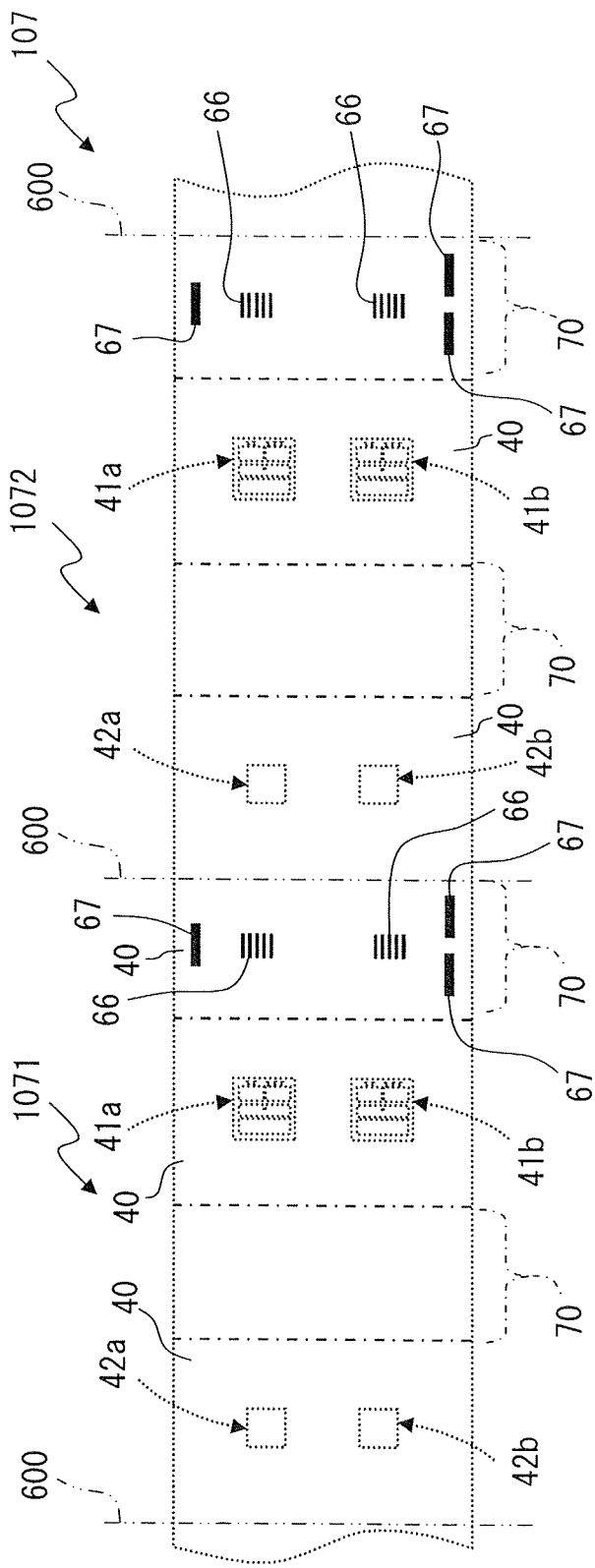
FIG. 25 is a plan view of a base circuit board according to a tenth modification of the present invention.
Figure 26:
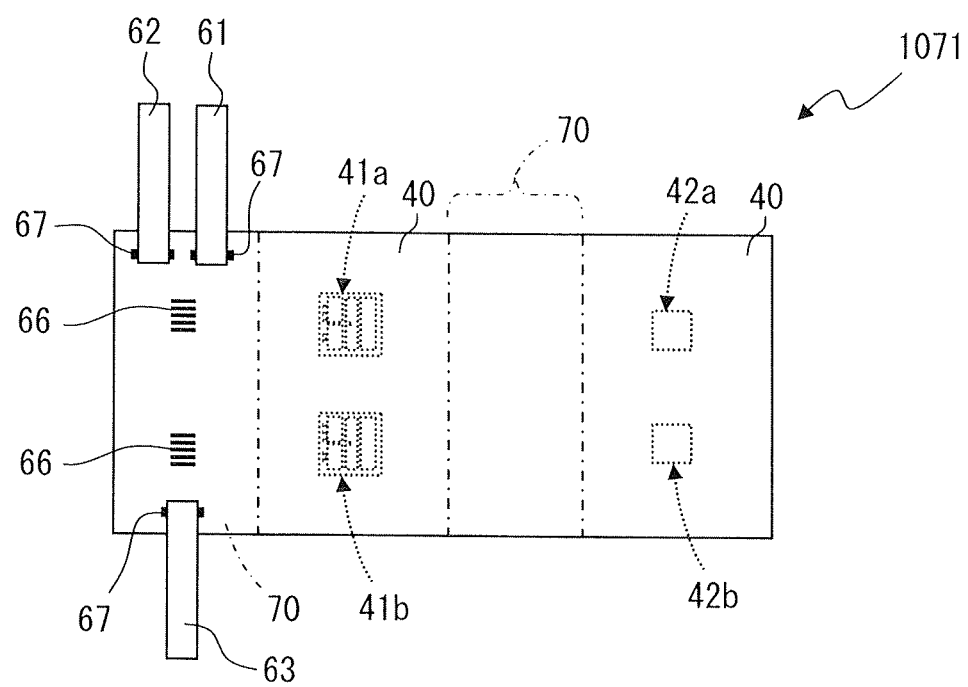
FIG. 26 is a plan view of a circuit board with embedded electronic parts according to the tenth modification.

As shown in FIG. 25, a base circuit board 107 having multiple embedding portions 40 and multiple bent portions 70 is manufactured. Then, the base circuit board 107 is cut into predetermined sections, such as into circuit boards 1071, 1072, along cutting lines 600 as necessary. Here, each section forming each of the circuit boards 1071, 1072 is configured as 2in1Package.

In this way, by cutting the base circuit board 107 along the cutting lines 600, circuit boards each configured as from 2in1Package to 6in1Package or more can be manufactured.

As shown in FIG. 25, pads 67 for terminal connection are provided on the surface of the base circuit board 107. Further, as shown in FIG. 26, the terminals 61 through 63 are connected to the pads 67 in each of the circuit boards 1071, 1072 cut from the base circuit board 107. Also in the first through ninth modifications, the terminals 61 through 65 may be connected to the pads 67.

Some of the pads 67 may not have connection with the terminals 61 through 63. In such a case, the pads 67 to which the terminals 61 through 63 are not connected are covered with an insulating film, such as a polyimide resin film, to restrict from being exposed.

(Eleventh Modification)

An eleventh modification will be described hereinafter with reference to FIGS. 27 and 28.

Figure 27:
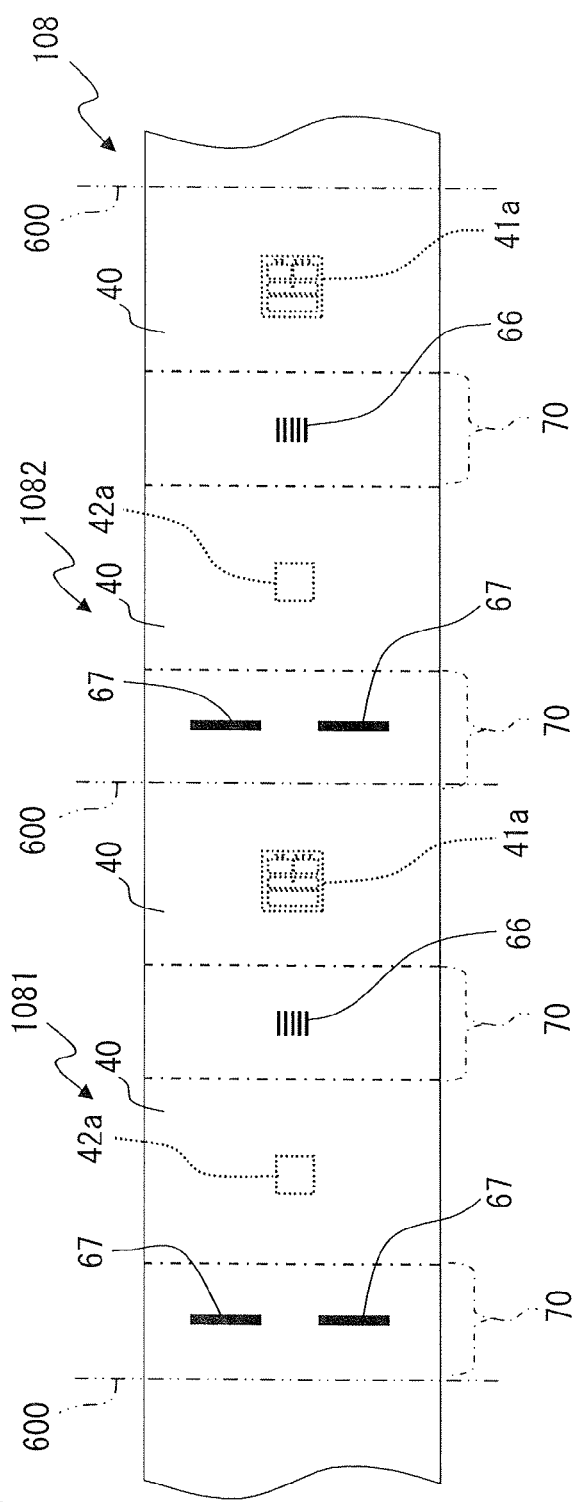
FIG. 27 is a plan view of a base circuit board according to an eleventh modification of the present invention.
Figure 28:
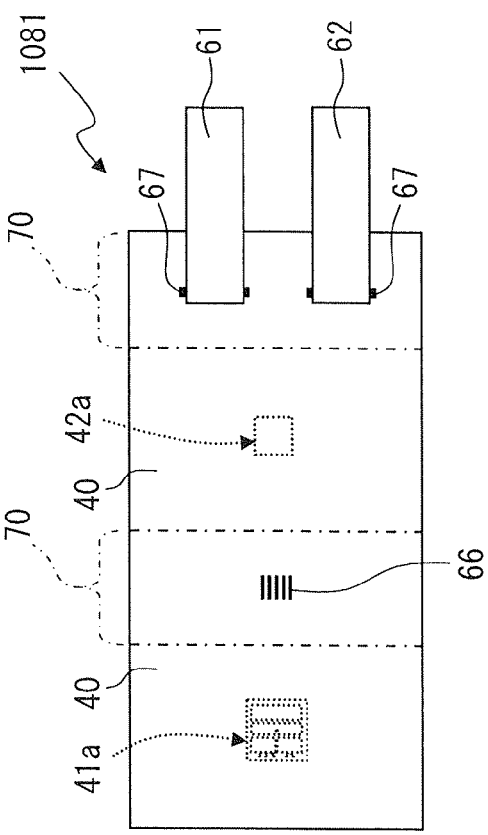
FIG. 28 is a plan view of a circuit board with embedded electronic parts according to the eleventh modification.

As shown in FIG. 27, a base circuit board 108 having multiple embedding portions 40 and multiple bent portions 70 is manufactured. Then, the base circuit board 108 is cut into predetermined sections, such as circuit boards 1081, 1082, along the cutting lines 600. In this case, each section forming each of the circuit boards 1081, 1082 is configured as 1in1Package. Therefore, by cutting the base circuit board 108 along the cutting lines 600, circuit boards as from 1in1Package to 6in1Package or more can be manufactured.

As shown in FIG. 27, the pads 67 for terminal connection are provided on the surface of the base circuit board 108. Further, as shown in FIG. 28, the terminals 61 and 62 are connected to the pads 67 of each of the circuit boards 1081, 1082 cut from the base circuit board 108.

Some of the pads 67 may not be connected with the terminals 61, 62. The pads 67 to which the terminals 61, 62 are not connected may be covered with an insulating film, such as a polyimide resin film, so as to restrict from being exposed.

The first through eleventh modifications can be solely implemented. Alternatively, the first through eleventh modifications can be combined in various ways. Additional advantages and modifications will readily occur to those skilled in the art. The invention in its broader term is therefore not limited to the specific details, representative apparatus, and illustrative examples shown and described.

What is claimed is:

1. A fixing structure comprising:
   a cooler including a plurality of fixing parts arranged in a first direction, each of the fixing parts defining a refrigerant passage therein through which refrigerant flows; and
   a circuit board fixed to the cooler, the circuit board including a wiring part, a plurality of electronic parts electrically connected to the wiring part, and an insulating base material containing resin and embedding the wiring part and the electronic parts therein, the insulating base material including embedding portions in which the electronic parts are embedded and a bent portion having flexibility between the embedding portions, wherein
   the bent portion is opposed to an end portion of one of the fixing parts, the end portion being located at an end of the one with respect to a second direction perpendicular to the first direction, and
   each of the embedding portions is held by adjacent two fixing parts such that opposite surfaces of the embedding portion are closely in contact with the adjacent two fixing parts.

2. The fixing structure according to claim 1, wherein
   the circuit board includes a plurality of bent portions, and
   adjacent two bent portions are fixed to end portions of the adjacent two fixing parts, the end portions being opposite to each other with respect to the second direction.

3. The fixing structure according to claim 1, wherein the bent portion has a shape corresponding to a shape of the end portion of the fixing part, and is closely in contact with the end portion.

4. The fixing structure according to claim 1, wherein the circuit board further includes a heat radiating member made of metal, and
the heat radiating member provides each of the opposite surfaces of the embedding portion.

5. The fixing structure according to claim 4, wherein the circuit board further includes a heat radiating connecting part made of metal,
the heat radiating connecting part is mechanically connected to the electronic parts without being electrically connected to the electronic parts, and
the heat radiating connecting part is mechanically connected to the heat radiating member.

6. The fixing structure according to claim 4, wherein the heat radiating member is inflexible.

7. The fixing structure according to claim 4, wherein the heat radiating member has flexibility and provides a continuous surface layer of the embedding portions and the bent portion.

8. The fixing structure according to claim 1, wherein the circuit board further includes a heat radiating connecting part made of metal,
the heat radiating connecting part is mechanically connected to the electronic parts in the insulating base material without being electrically connected to the electronic parts, and
the heat radiating connecting part partly exposes from a surface of the insulating base material to be closely in contact with the fixing part.

9. The fixing structure according to claim 1, wherein the circuit board further includes a terminal electrically connected to the wiring part, and
the terminal is located at a surface of the bent portion to be electrically connected to an external device, the surface being opposite to a surface of the bent portion that is opposed to the end portion of the fixing part.

10. The fixing structure according to claim 9, wherein the end portion of the fixing part to which the bent portion is fixed projects from end portions of adjacent fixing parts with respect to the second direction.

11. The fixing structure according to claim 1, wherein the end portion of the fixing part has a curved shape.

12. The fixing structure according to claim 1, wherein a thickness of the circuit board is reduced at the bent portion.

13. The fixing structure according to claim 1, wherein an entirety of the insulating base material has flexibility.

14. The fixing structure according to claim 1, wherein the wiring part and the electronic parts constitute an inverter circuit.

15. The fixing structure according to claim 1, wherein the insulating base material is constructed of a stack of base films containing thermoplastic resin, the base films being bonded with one another.

16. The fixing structure according to claim 15, wherein the base films include conductive patterns and interlayer connecting portions as the wiring part, and
the interlayer connecting portions are provided by conductive members that are disposed in via holes of the base films to electrically connect at least one of between the conductive patterns and between the conductive patterns and the electronic parts.

17. A fixing method for fixing a circuit board to a cooler, the circuit board including a wiring part, a plurality of electronic parts electrically connected to the wiring part and an insulating base material embedding the wiring part and the electronic parts therein, the insulating base material including embedding portions embedding the electronic parts therein and a flexible portion between the embedding portions, the cooler including a plurality of fixing parts arranged in a first direction and defining a refrigerant passage therein through which refrigerant flows,
the fixing method comprising:
arranging the circuit board to the cooler while bending the flexible portion such that each of the embedding portions is disposed between adjacent two fixing parts and the flexible portion is opposed to an end portion of one of the fixing parts, the end portion being at an end of the one with respect to a second direction perpendicular to the first direction; and
applying pressure to the cooler in a direction parallel to the first direction such that opposite surfaces of each of the embedding portions are brought into contact with the adjacent two fixing parts and the embedding portion is held by the adjacent two fixing parts.

18. The fixing method according to claim 17, wherein the arranging includes pulling opposite ends of the circuit board in a direction parallel to the second direction such that the flexible portion is brought into contact with the end portion and flexed along a shape of the end portion, and each of the embedding portions is received between the adjacent two fixing parts.

* * * * *